US012677414B2

(12) United States Patent
Iwai et al.

(10) Patent No.: US 12,677,414 B2
(45) Date of Patent: Jul. 7, 2026

(54) THREE-DIMENSIONAL MEMORY DEVICE INCLUDING HORIZONTAL SEMICONDUCTOR CHANNELS AND METHODS OF FORMING THE SAME

(71) Applicant: WESTERN DIGITAL TECHNOLOGIES, INC., San Jose, CA (US)

(72) Inventors: Takaaki Iwai, Nagoya (JP); Shinsuke Yada, Yokkaichi (JP); Tadashi Nakamura, Yokkaichi (JP); Hiroyuki Ogawa, Nagoya (JP)

(73) Assignee: Sandisk Technologies, Inc., Milpitas, CA (US)

( * ) Notice: Subject to any disclaimer, the term of this patent is extended or adjusted under 35 U.S.C. 154(b) by 429 days.

(21) Appl. No.: 18/349,488

(22) Filed: Jul. 10, 2023

(65) Prior Publication Data

US 2025/0024672 A1     Jan. 16, 2025

(51) Int. Cl.
*H10B 41/27* (2023.01)
*G11C 16/04* (2006.01)
(Continued)

(52) U.S. Cl.
CPC ......... *H10B 41/27* (2023.02); *G11C 16/0483* (2013.01); *H10B 41/10* (2023.02); *H10B 41/35* (2023.02); *H10B 43/10* (2023.02); *H10B 43/27* (2023.02); *H10B 43/35* (2023.02); *H10W 20/42* (2026.01); *H10W 20/435* (2026.01)

(58) Field of Classification Search
CPC ........ H10B 41/27; H10B 41/10; H10B 41/35; H10B 43/10; H10B 43/35; H10B 43/50; G11C 16/0483; H01L 23/5226; H01L 23/5283
See application file for complete search history.

(56) References Cited

U.S. PATENT DOCUMENTS 10,256,247 B1     4/2019  Kanakamedala et al.
10,381,409 B1     8/2019  Zhou et al.
(Continued)

FOREIGN PATENT DOCUMENTS

KR      20100081559 A      7/2010
KR      20160059930 A      5/2016
KR      20220047506 A      4/2022

OTHER PUBLICATIONS

Barraud, S. et al., "Vertically Stacked-NanoWires MOSFETs in a Replacement Metal Gate Process with Inner Spacer and SiGe Source/Drain," STMicroelectronics, IEEE, pp. 17.6.1-17.6.4, IEDM16-464—IEDM16-467, (2016).
(Continued)

*Primary Examiner* — William B Partridge
*Assistant Examiner* — David Paul Sedorook
(74) *Attorney, Agent, or Firm* — THE MARBURY LAW GROUP PLLC

(57) ABSTRACT
A method of forming three-dimensional memory device includes forming an alternating stack of insulating layers and semiconductor material layers over a substrate, and forming laterally alternating sequences of laterally-insulated electrode structures and dielectric isolation pillar structures through the alternating stack. At least a portion of the laterally-insulated electrode structures each include a memory film and a word line electrode.

13 Claims, 30 Drawing Sheets

(51) Int. Cl.
| | |
|---|---|
| *H10B 41/10* | (2023.01) |
| *H10B 41/35* | (2023.01) |
| *H10B 43/10* | (2023.01) |
| *H10B 43/27* | (2023.01) |
| *H10B 43/35* | (2023.01) |
| *H10W 20/41* | (2026.01) |
| *H10W 20/42* | (2026.01) |

(56) References Cited

U.S. PATENT DOCUMENTS

| | | | |
|---|---|---|---|
| 10,381,559 | B1 | 8/2019 | Zhou et al. |
| 10,833,101 | B2 | 11/2020 | Shimomura et al. |
| 10,950,626 | B2 | 3/2021 | Kai et al. |
| 11,018,153 | B2 | 5/2021 | Kai et al. |
| 11,049,807 | B2 | 6/2021 | Li et al. |
| 11,088,170 | B2 | 8/2021 | Zhang et al. |
| 2002/0028541 | A1* | 3/2002 | Lee ........................ G11C 16/26 |
| | | | 438/149 |
| 2007/0029607 | A1 | 2/2007 | Kouznetzov |
| 2013/0052803 | A1 | 2/2013 | Roizin et al. |
| 2016/0172369 | A1 | 6/2016 | Hu et al. |
| 2016/0329341 | A1 | 11/2016 | Shimabukuro et al. |
| 2017/0125433 | A1 | 5/2017 | Ogawa et al. |
| 2019/0221558 | A1 | 7/2019 | Chen et al. |
| 2020/0013791 | A1* | 1/2020 | Or-Bach ............ G11C 11/5628 |
| 2020/0044087 | A1 | 2/2020 | Guha et al. |
| 2020/0051908 | A1 | 2/2020 | Matsuura |
| 2021/0020654 | A1 | 1/2021 | Oh et al. |
| 2021/0159248 | A1 | 5/2021 | Zhang et al. |
| 2021/0202703 | A1 | 7/2021 | Rajashekhar et al. |
| 2021/0320094 | A1* | 10/2021 | Zhang ..................... H01L 24/08 |
| 2025/0322852 | A1* | 10/2025 | Sato ..................... H10D 64/035 |

OTHER PUBLICATIONS

Breil, N. et al., "Highly-selective superconformal CVD Ti silicide process enabling area-enhanced contacts for next-generation CMOS architectures," 2017 Symposium on VLSI Technology Digest of Technical Papers, JSAP, pp. T216-T217, (2017).

Chen, C.P. et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology Digest of Technical Papers, pp. 91-92, (2012).

Compagnoni, C.M. et al., "Reviewing the Evolution of the NAND Flash Technology," in *Proceedings of the IEEE*, vol. 105, No. 9, pp. 1609-1633, Sep. 2017, doi: 10.1109/JPROC.2017.2665781.

Endoh, T. et al., "Novel Ultra High-Density Flash Memory with A Stacked-Surrounding Gate Transistor (S-GT) Structured Cell," IEDM Proc., pp. 33-36, (2001).

Hsiao, Y.H. et al., "A critical examination of 3D stackable NAND Flash memory architectures by simulation study of the scaling capability," Proceedings of *2010 IEEE International Memory Workshop*, 978-1-4244-6721-1, Date of Conference: May 16-19, 2010, Seoul, S. Korea, (2010).

Kikuchi, Y. et al., "Electrical Characteristics of p-Type Bulk Si Fin Field-Effect Transistor Using Solid-Source Doping With 1-nm Phosphosilicate Glass," IEEE Electronic Device Letters, vol. 37, No. 9, pp. 1084-1087, (2016).

Loubet, N. et al., "Selective etching of Si1—xGex versus Si with gaseous HCl for the formation of advanced CMOS devices," Thin Solid Films, vol. 517, pp. 93-97, (2008).

Loubet, N. et al., "Stacked Nanosheet Gate-All-Around Transistor to Enable Scaling Beyond FinFET," 2017 Symposium on VLSI Technology Proceedings, Jun. 2017, 3 pages, (2017).

Lue, H.T. et al., "Overview of 3D Nand Flash and progress of vertical gate (VG) architecture," *2012 IEEE 11th International Conference on Solid-State and Integrated Circuit Technology*, Xi'an, China, 2012, pp. 1-4, doi: 10.1109/ICSICT.2012.6466681.

Mertens, H. et al., "Vertically Stacked Gate-All-Around Si Nanowire Transistors: Key Process Optimizations and Ring Oscillator Demonstration," Applied Materials, Crown, pp. 37.4.1-37.4.4, IEDM17-828 to IEDM17-831, (2017).

Mertens, H. et al., "Vertically Stacked Gate-All-Around Si Nanowire CMOS Transistors with Dual Work Function Metal Gates," IEEE, pp. 19.7.1-19.7.4, IEDM16-524 to IEDM16-527, (2016).

Mikolajick, T. et al., "Doped Hafnium Oxide—An Enabler for Ferroelectric Field Effect Transistors," *Advances in Science and Technology* vol. 95, pp. 136-145, (2014).

Nitayama, A. et al., "Bit Cost Scalable (BiCS) Flash Technology for Future Ultra High Density Storage Devices," IEEE, pp. 130-131, (2010).

Weckx, P. et al., "Stacked nanosheet fork architecture for SRAM design and device co-optimization toward 3nm," IEEE, pp. 20.5.1-20.5.4, IEDM17-505 to IEDM17-508, (2017).

ISR-WO—Notification of Transmittal of The International Search Report and Written Opinion of the International Searching Authority for International Patent Application No. PCT/US2024/029535, mailed Sep. 12, 2024, 8 pages.

IPRP-WO—Notification Concerning Transmittal of International Preliminary Report on Patentability and Written Opinion of the International Searching Authority for International Patent Application No. PCT/US2024/029535, mailed Jan. 22, 2026, 5 pages.

* cited by examiner

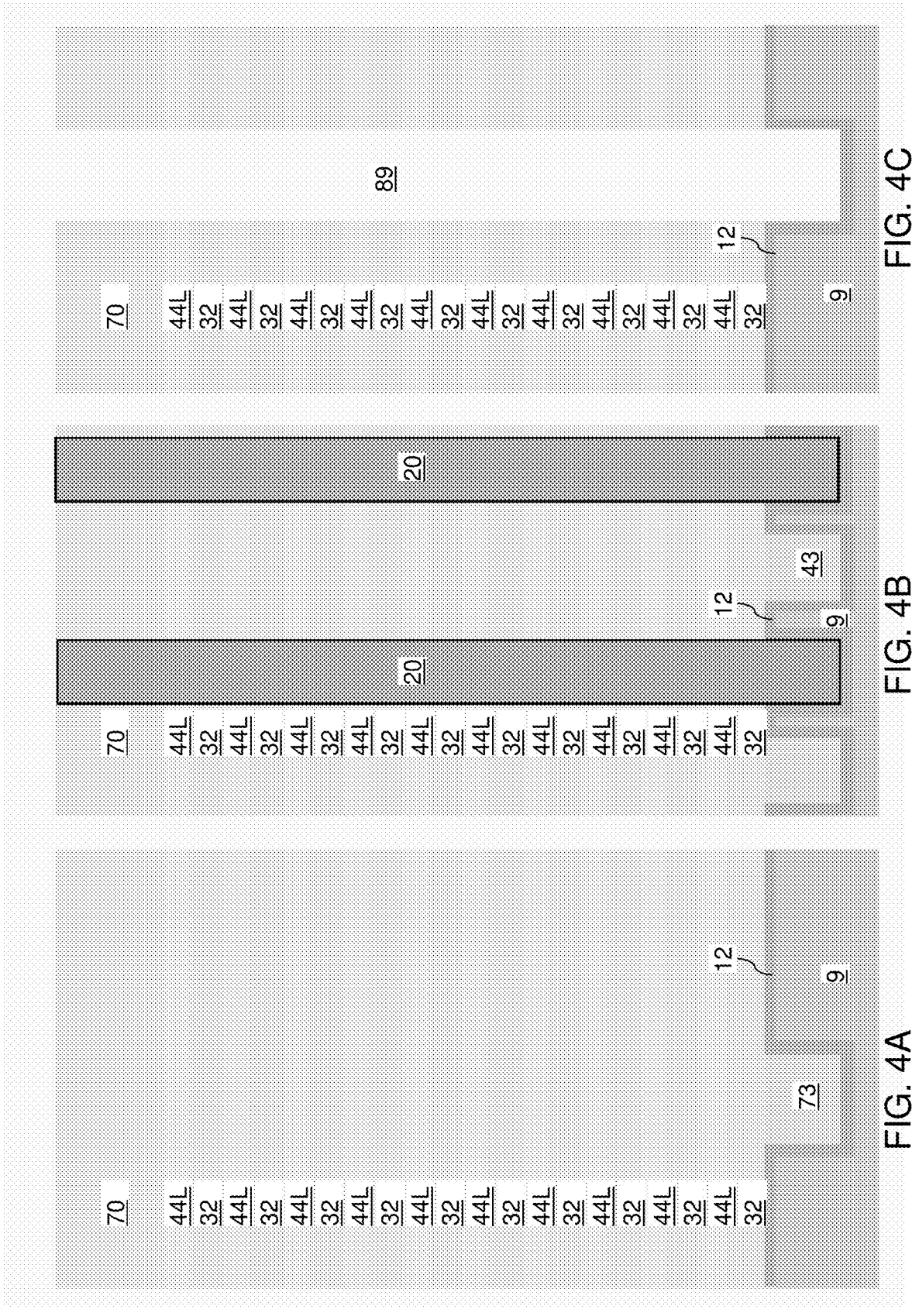

Figure 13B:
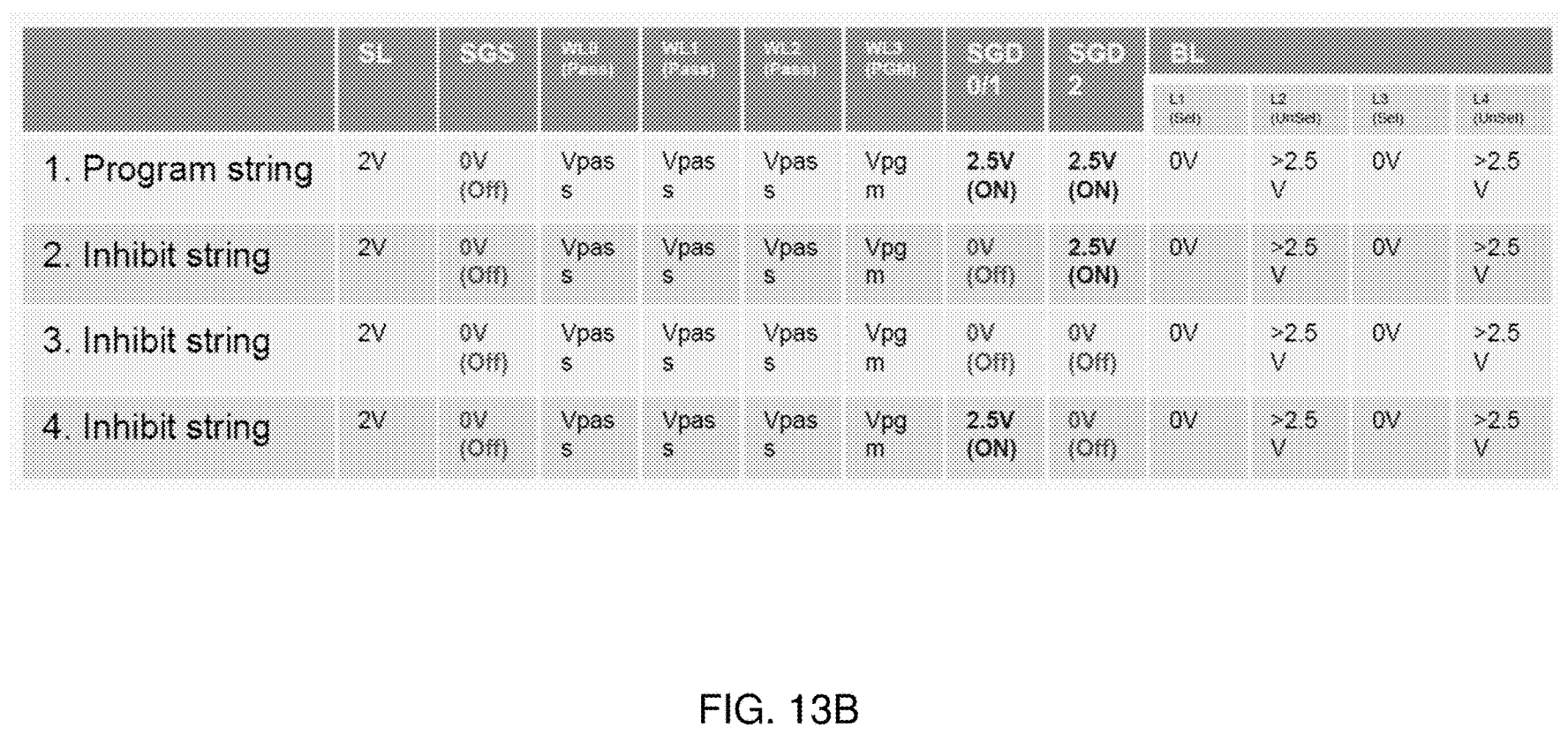

| | SL | SGS | | | | Vpgm | SGD | SGD | BL L1 (Sel) | L2 (Unsel) | L3 (Sel) | L4 (Unsel) |
|---|---|---|---|---|---|---|---|---|---|---|---|---|
| 1. Program string | 2V | 0V (Off) | Vpass | Vpass | Vpass | Vpgm | 2.5V (ON) | 2.5V (ON) | 0V | >2.5 V | 0V | >2.5 V |
| 2. Inhibit string | 2V | 0V (Off) | Vpass | Vpass | Vpass | Vpgm | 0V (Off) | 2.5V (ON) | 0V | >2.5 V | 0V | >2.5 V |
| 3. Inhibit string | 2V | 0V (Off) | Vpass | Vpass | Vpass | Vpgm | 0V (Off) | 0V (Off) | 0V | >2.5 V | 0V | >2.5 V |
| 4. Inhibit string | 2V | 0V (Off) | Vpass | Vpass | Vpass | Vpgm | 2.5V (ON) | 0V (Off) | 0V | >2.5 V | 0V | >2.5 V |

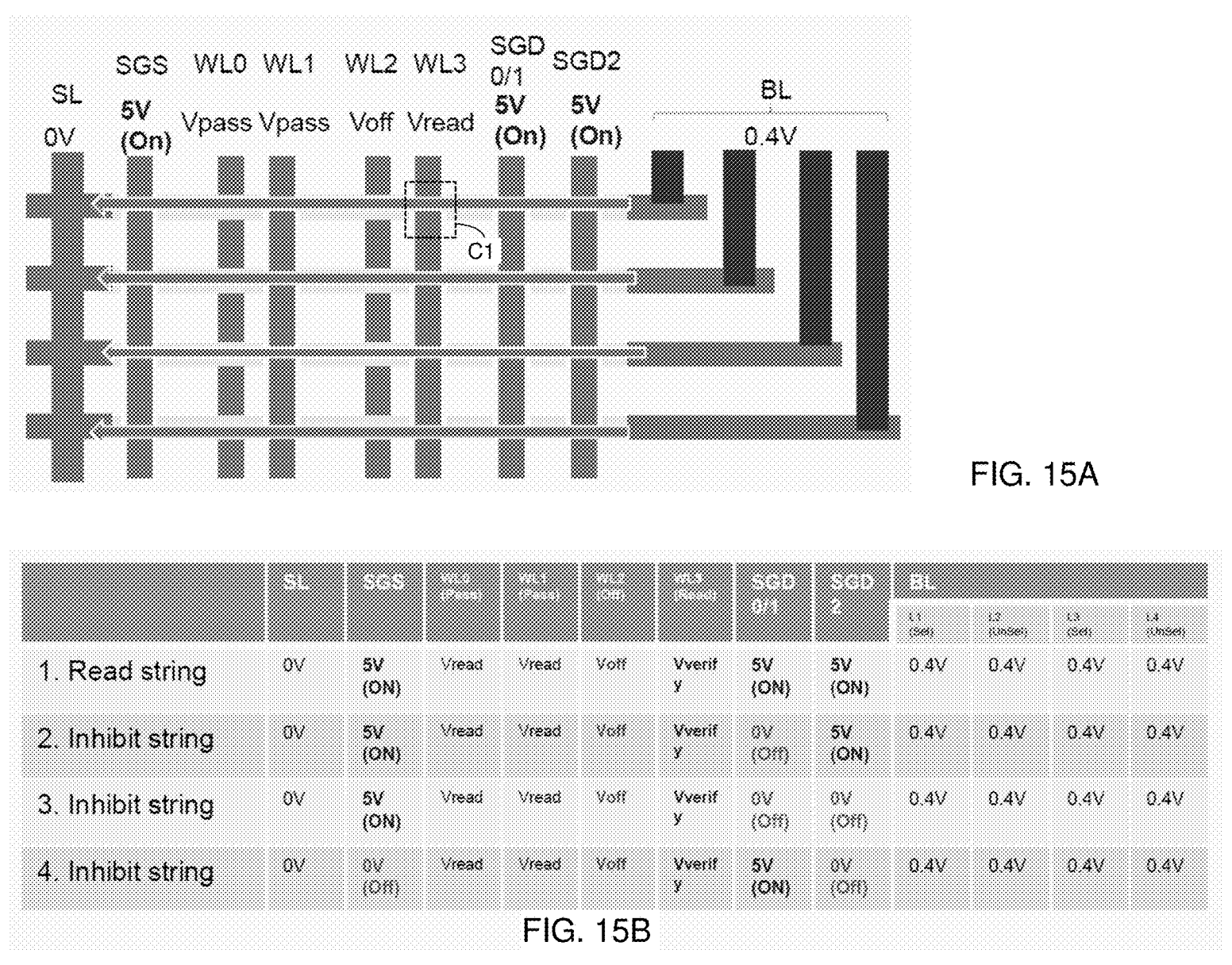

| | SL | SGS | | | | | | SGD1 | SGD2 | BL | | | | |
|---|---|---|---|---|---|---|---|---|---|---|---|---|---|---|
| | | | | | | | | | | Off Sel | Off Sel | Off Sel | Off Sel | Off Sel |
| 1. Read string | 0V | 5V (ON) | Vread | Vread | Vread | Voff | Vverify | 5V (ON) | 5V (ON) | 0.4V | 0.4V | 0.4V | 0.4V | 0.4V |
| 2. Inhibit string | 0V | 5V (ON) | Vread | Vread | Vread | Voff | Vverify | 0V (Off) | 5V (ON) | 0.4V | 0.4V | 0.4V | 0.4V | 0.4V |
| 3. Inhibit string | 0V | 5V (ON) | Vread | Vread | Vread | Voff | Vverify | 0V (Off) | 0V (Off) | 0.4V | 0.4V | 0.4V | 0.4V | 0.4V |
| 4. Inhibit string | 0V | 0V (Off) | Vread | Vread | Vread | Voff | Vverify | 5V (ON) | 0V (Off) | 0.4V | 0.4V | 0.4V | 0.4V | 0.4V |

FIG. 15B

THREE-DIMENSIONAL MEMORY DEVICE INCLUDING HORIZONTAL SEMICONDUCTOR CHANNELS AND METHODS OF FORMING THE SAME

FIELD

The present disclosure relates generally to the field of semiconductor devices, and particularly to a three-dimensional memory device including horizontal semiconductor channels and methods for manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a semiconductor device comprises: a vertically alternating sequence of vertically-perforated insulating layers and vertically-perforated composite layers, wherein a plurality of elongated openings vertically extends through each of the vertically-perforated insulating layers and the vertically-perforated composite layers in the vertically alternating sequence; each of the vertically-perforated composite layers comprises a respective plurality of horizontal semiconductor channel strips; and each of the respective plurality of horizontal semiconductor channel strips is located between each neighboring pair of the plurality of elongated openings; and laterally alternating sequences of laterally-insulated electrode structures and dielectric isolation pillar structures, wherein each of the laterally alternating sequences is located within a respective elongated opening of the plurality of elongated openings, and a respective subset of the laterally-insulated electrode structures and a respective subset of the dielectric isolation pillar structures laterally alternate along a first horizontal direction within each of the laterally alternating sequences.

According to another aspect of the present disclosure, a method of forming three-dimensional memory device includes forming an alternating stack of insulating layers and semiconductor material layers over a substrate, and forming laterally alternating sequences of laterally-insulated electrode structures and dielectric isolation pillar structures through the alternating stack. At least a portion of the laterally-insulated electrode structures each include a memory film and a word line electrode.

BRIEF DESCRIPTION OF THE DRAWINGS

FIGS. 1A, 1B, and 1C are vertical cross-sectional views, and FIG. 1D is a top-down view. The vertical planes A-A', B-B', and C-C' in FIG. 1D are cut planes for FIG. 1A, FIG. 1B, and FIG. 1C, respectively.

FIGS. 4A-4D are various views of the exemplary structure after formation of a source-side trench according to an embodiment of the present disclosure. FIGS. 4A, 4B, and 4C are vertical cross-sectional views, and FIG. 4D is a top-down view. The vertical planes A-A', B-B', and C-C' in FIG. 4D are cut planes for FIG. 4A, FIG. 4B, and FIG. 4C, respectively.

FIGS. 6A, 6B, and 6C are vertical cross-sectional views, and FIG. 6D is a top-down view. The vertical planes A-A', B-B', and C-C' in FIG. 6D are cut planes for FIG. 6A, FIG. 6B, and FIG. 6C, respectively. FIG. 6E is a horizontal cross-sectional view of a region the exemplary structure along the horizontal plane E-E' of FIG. 6B.

FIGS. 10A, 10B, and 10C are vertical cross-sectional views, and FIG. 10D is a horizontal cross-sectional view along the horizontal plane D-D' in FIGS. 10A-10C. The vertical planes A-A', B-B', and C-C' in FIG. 10D are cut planes for FIG. 10A, FIG. 10B, and FIG. 10C, respectively.

FIG. 11D is a partial see-through top-down view of the exemplary structure from a level of the electrode-contact via structures. FIG. 11E is a partial see-through top-down view of the exemplary structure from a first metal line level. FIG. 11F is a partial see-through top-down view of the exemplary structure from a level of the connection via structures. FIG. 11G is a partial see-through top-down view of the exemplary structure from a second metal line level.

FIG. 13A is a schematic vertical cross-sectional view of the exemplary structure during a programming operation, while FIG. 13B is a programming table for the exemplary structure of FIG. 13A.

FIG. 15A is a schematic vertical cross-sectional view of the exemplary structure during a reading operation, while FIG. 15B is a reading table for the exemplary structure of FIG. 15A.

DETAILED DESCRIPTION

Figures 1A, 1B, 1C:
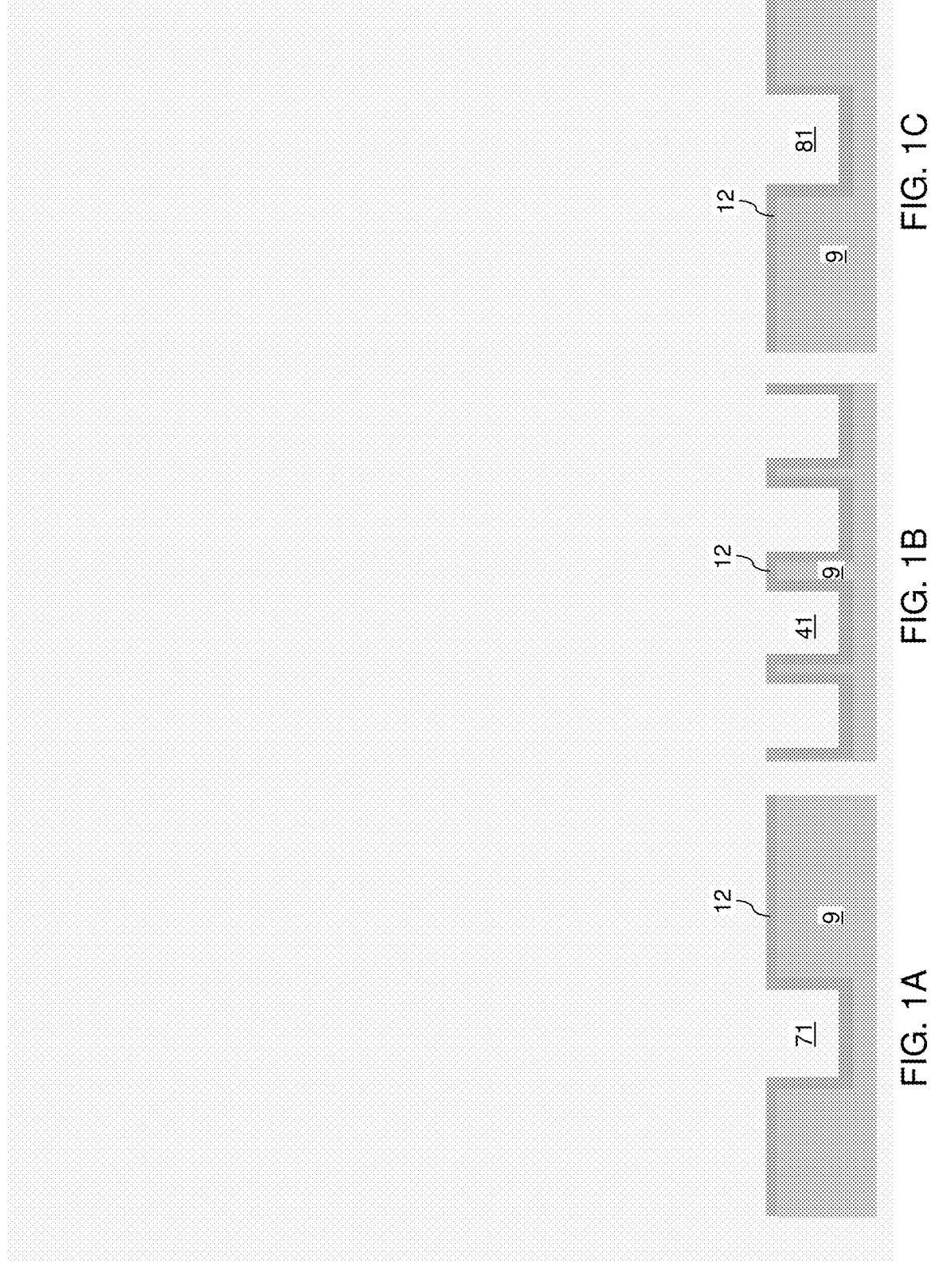
FIGS. 1A-1D are various views of an exemplary structure after formation of various recesses into a substrate and a dielectric etch stop layer according to an embodiment of the present disclosure.
Figure 1D:
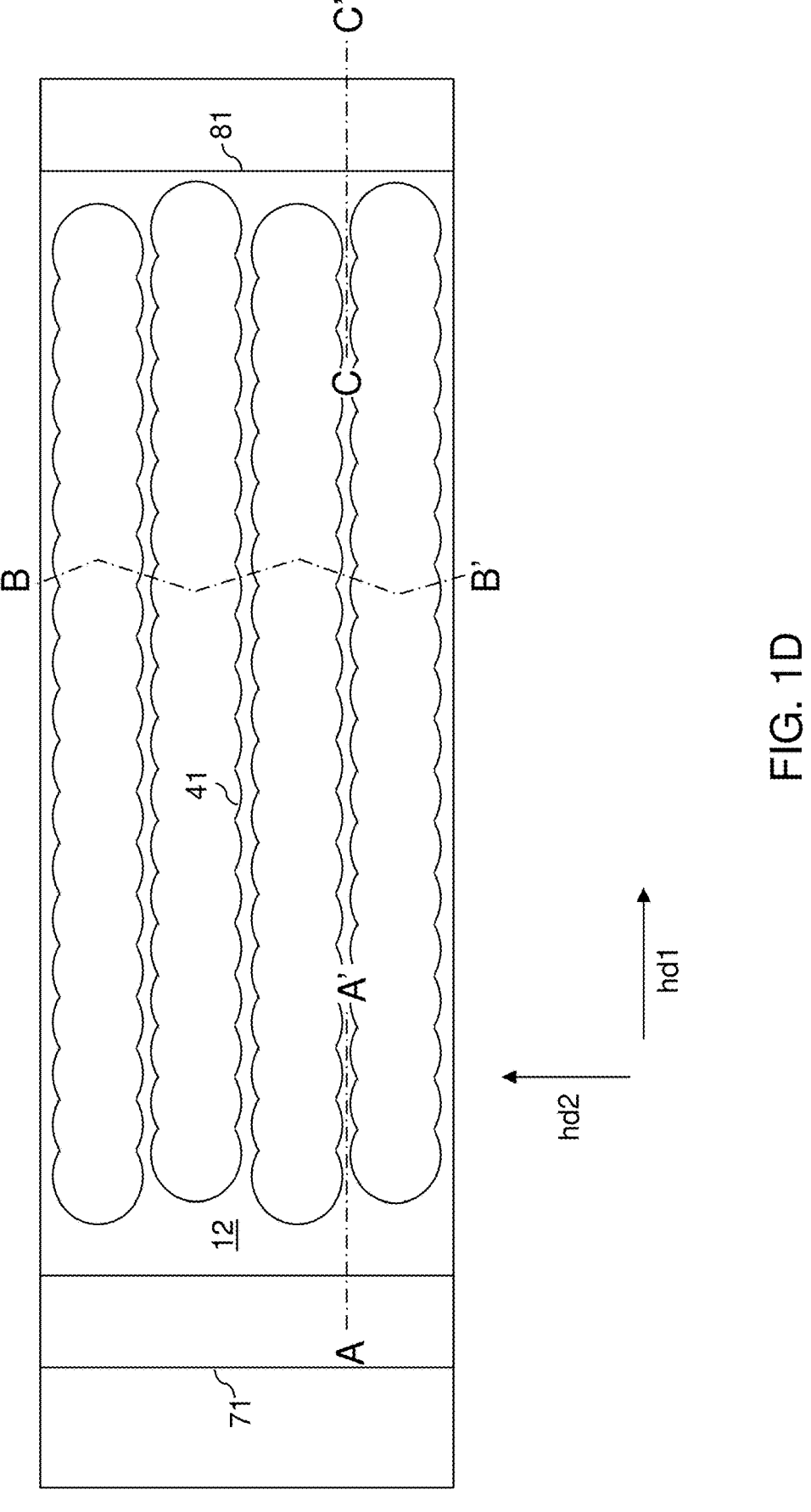

As discussed above, the present disclosure is directed to a three-dimensional memory device including horizontal semiconductor channels and methods of manufacturing the same, the various aspects of which are described below. Embodiments of the disclosure can be employed to form various structures including a multilevel memory structure, non-limiting examples of which include semiconductor devices such as three-dimensional memory array devices comprising a plurality of memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, an element located "on" a second element can be located on the exterior side of a surface of the second element or on the interior side of the second element. As used herein, an element is located "directly on" a second element if there exist a physical contact between a surface of the element and a surface of the second element. As used herein, an element is "electrically connected to" a second element if there exists a conductive path consisting of at least one conductive material between the element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased in a single erase operation. Each block contains a number of pages, which are the smallest unit that can be programmed, i.e., a smallest unit on which a read operation can be performed.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Referring to FIGS. 1A-1D, an exemplary structure according to an embodiment of the present disclosure is illustrated, which comprises a substrate 9 and a dielectric etch stop layer 12. The substrate 9 may comprise any substrate that can provide sufficient mechanical strength to device structures to be subsequently performed. Generally, the substrate 9 may comprise a semiconductor substate, an insulating substrate, or a conductive substrate. In one embodiment, the substrate 9 may comprise a semiconductor substrate such as a commercially available single crystalline silicon wafer.

The dielectric etch stop layer 12 comprises a material that may function as an etch stop material. The dielectric etch stop layer 12 may comprise silicon oxide, silicon nitride, a dielectric metal oxide, or a combination thereof. If the substrate 9 comprises a semiconductor substrate, such as a silicon substrate, the dielectric etch stop layer 12 may comprise a dielectric semiconductor oxide material, such as silicon oxide, that can be formed by oxidation of a surface portion of the semiconductor substrate.

In one embodiment, a photoresist layer (not shown) may be applied over the substrate 9, and can be lithographically patterned to form various vertical recesses in an upper portion of the substrate 9 prior to formation of the dielectric etch stop layer 12. The various vertical recesses may comprise a source-side recess 81, a drain-side recess 71, and electrode-region recesses 41. The source-side recess 81 and the drain-side recess 71 may be laterally spaced apart along a first horizontal direction hd1, and the electrode-region recesses 41 may be formed between the source-side recess 81 and the drain-side recess 71. The electrode-region recesses 41 may laterally extend along the first horizontal direction hd1, and may be laterally spaced apart from each other along a second horizontal direction hd2 that is perpendicular to the first horizontal direction hd1.

Figures 2A, 2B, 2C:
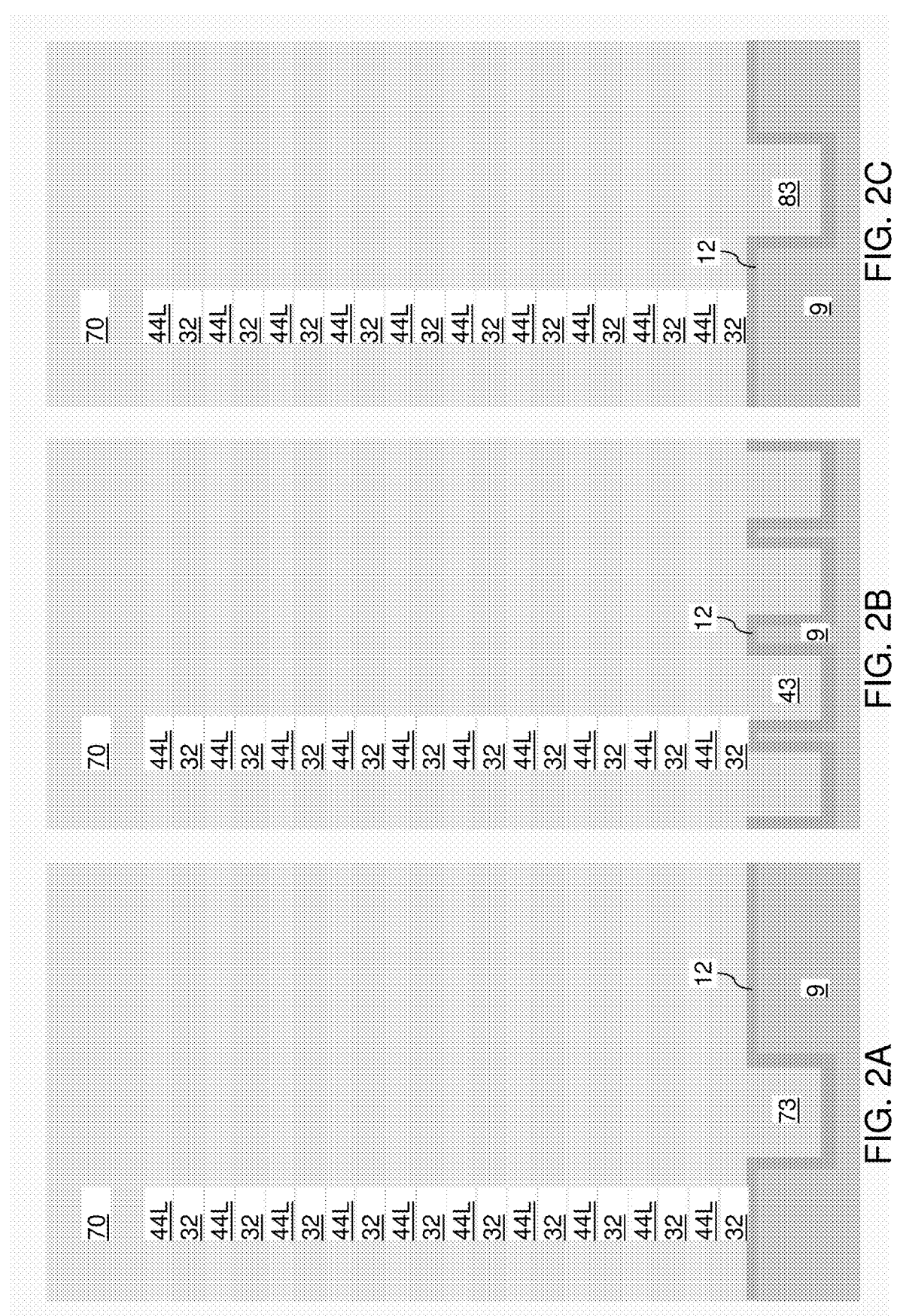
FIGS. 2A-2C are various view of the exemplary structure after formation of various sacrificial fill structures, an alternating stack of insulating layers and semiconductor material layers, and an insulating cap layer according to an embodiment of the present disclosure. The locations of the cut planes for FIGS. 2A, 2B, and 2C correspond to the locations of the vertical planes A-A', B-B', and C-C' in FIG. 1D, respectively.

Referring to FIGS. 2A-2C, a sacrificial fill material may be deposited in the various vertical recesses (81, 71, 41), and excess portions of the sacrificial fill material can be removed from above a horizontal plane including a topmost surface of the dielectric etch stop layer 12. The sacrificial fill material may comprise a carbon-based material, such as amorphous carbon or diamond-like carbon (DLC), or a semiconductor material, such as amorphous silicon, or organosilicate glass, or a polymer material. A remaining portion of the sacrificial fill material filling the source-side recess 81 constitutes a source-side sacrificial fill material portion 83. A remaining portion of the sacrificial fill material filling the drain-side recess 71 constitutes a drain-side sacrificial fill material portion 73. Each remaining portion of the sacrificial fill material filling the electrode-region recesses 41 constitutes an electrode-region sacrificial fill material portion 43. The sacrificial material portions (41, 73, 83) may comprise stopper regions (e.g., etch stop regions) for subsequent etch steps.

An alternating stack (32, 44L) of insulating layers 32 and semiconductor material layers 44L can be formed over the dielectric etch stop layer 12 and the various sacrificial fill material portions (83, 73, 43). The insulating layers 32 comprise an insulating material, such as silicon oxide (i.e., undoped silicate glass), a doped silicate glass, silicon nitride, and/or a dielectric metal oxide. In one embodiment, the insulating layers 32 comprise and/or consist essentially of silicon oxide.

The semiconductor material layers 44L comprise a semiconductor material that is either intrinsic or has a doping of first conductivity type. The first conductivity type may be p-type or n-type. In one embodiment, the semiconductor material layers 44L may comprise silicon, silicon-germanium, a compound semiconductor material (such as a III-V compound semiconductor material or a II-VI compound semiconductor material), a semiconducting metal oxide material (such as indium gallium zinc oxide), or a semiconducting metal chalcogenide material. For example, the semiconductor material layers 44L may comprise intrinsic or p-type polysilicon. The dopant concentration of dopants of the first conductivity type in the semiconductor material layer 44L may be in a range from $1.0 \times 10^{13}/\text{cm}^3$ to $1.0 \times 10^{18}/\text{cm}^3$, such as from $1.0 \times 10^{14}/\text{cm}^3$ to $1.0 \times 10^{17}/\text{cm}^3$, although lesser and greater dopant concentrations may also be employed.

The total number of repetitions of a pair of an insulating layer 32 and a semiconductor material layer 44L in the alternating stack (32, 44L) may be in a range from 2 to $2^{10}$, although a greater number may also be employed. The thickness of each insulating layer 32 may be in a range from 10 nm to 60 nm, although lesser and greater thicknesses may also be employed. The thickness of each semiconductor material layer 44L may be in a range from 10 nm to 60 nm, such as 15 nm to 25 nm, although lesser and greater thicknesses may also be employed. An insulating cap layer 70 may be formed over the alternating stack (32, 44L). The thickness of the insulating cap layer 70 may be in a range from 20 nm to 200 nm, although lesser and greater thicknesses may also be employed.

Figures 3A, 3B, 3C:
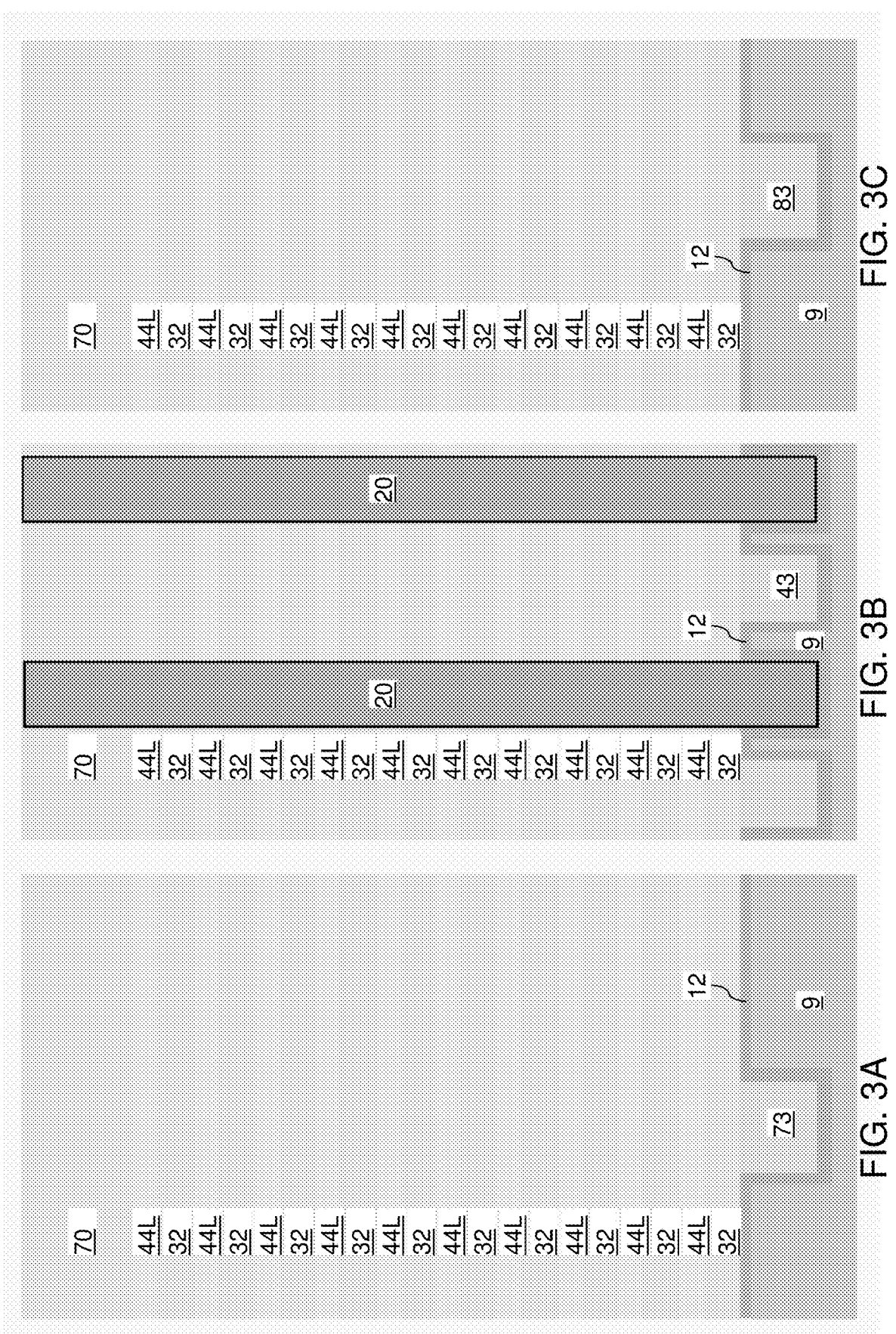
FIGS. 3A-3C are various view of the exemplary structure after formation of dielectric isolation pillar structures according to an embodiment of the present disclosure. The locations of the cut planes for FIGS. 3A, 3B, and 3C correspond to the locations of the vertical planes A-A', B-B', and C-C' in FIG. 1D, respectively.
Figure 4D:
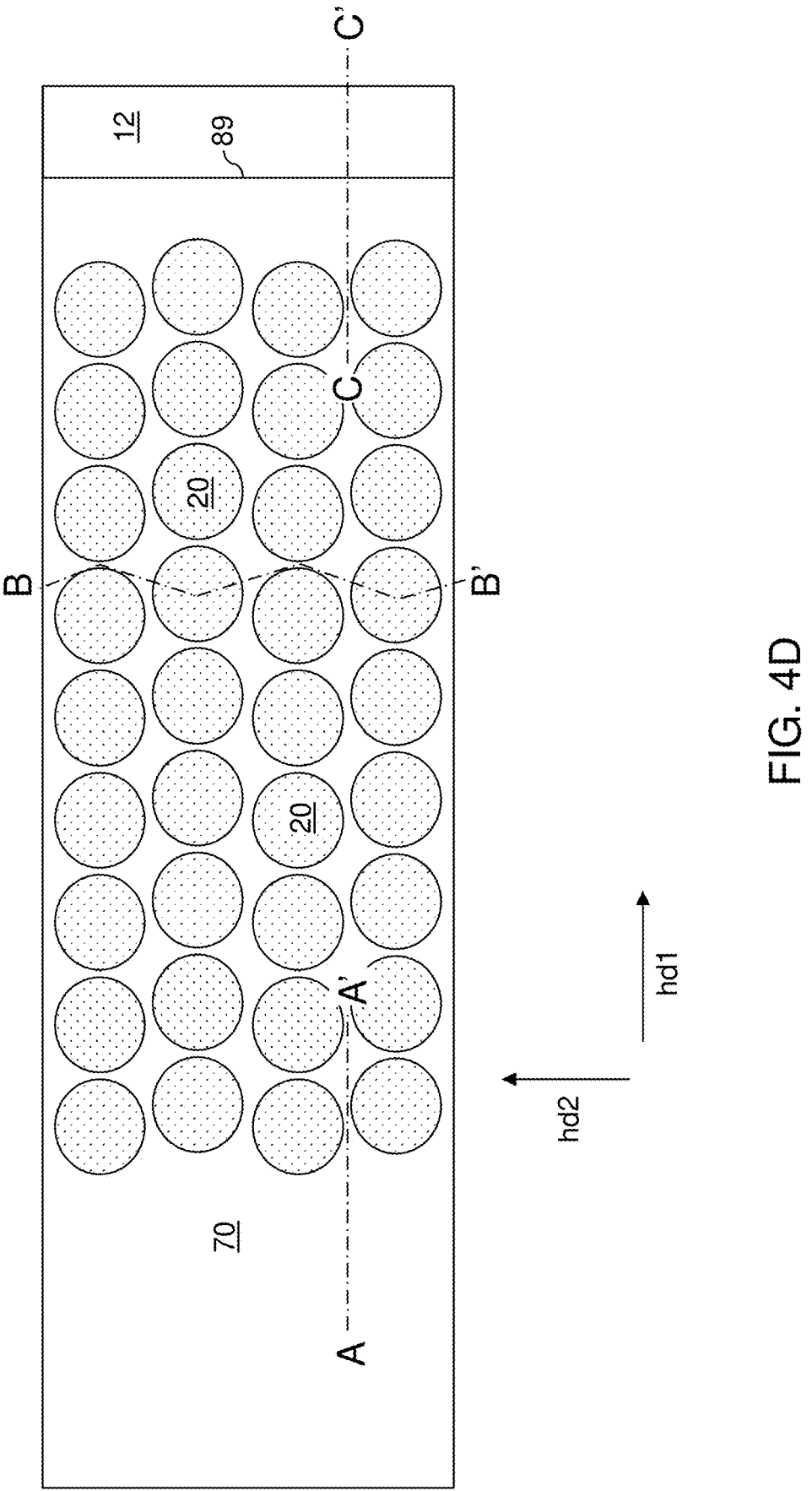

FIGS. 3A-3C are various view of the exemplary structure after formation of dielectric isolation pillar structures 20 according to an embodiment of the present disclosure. Referring to FIGS. 3A-3C, a photoresist layer (not shown) can be applied over the insulating cap layer 70, and can be lithographically patterned to form an array of discrete openings within the areas of the electrode-region sacrificial fill material portions 43. A one-dimensional array of discrete openings may be formed over each electrode-region sacrificial fill material portion 43. An anisotropic etch process can be performed to transfer the pattern of the openings in the photoresist layer through the insulating cap layer 70 and the alternating stack (32, 44L) to form isolation openings. In one embodiment, the isolation openings may have a cylindrical shape. Portions of the electrode-region sacrificial fill material portions 43 that underlie the isolation openings may be removed by extending the anisotropic etch process with a change in the etch chemistry. Thus, the isolation openings can vertically extend through the insulating cap layer 70 and the alternating stack (32, 44L) to a top surface of the dielectric etch stop layer 12. The photoresist layer can be removed, for example, by ashing.

A dielectric fill material, such as silicon oxide, can be deposited in the isolation openings. Excess portions of the dielectric fill material may be removed from above the top surface of the insulating cap layer 70 by performing a recess etch process. Each remaining portion of the dielectric fill material that fills a respective isolation opening constitutes a dielectric isolation pillar structure 20. A two-dimensional array of dielectric isolation pillar structures 20 can be formed.

Referring to FIGS. 4A-4D, a photoresist layer (not shown) can be applied over the insulating cap layer 70, and can be lithographically patterned to form a line-shaped opening within the area of the source-side sacrificial fill material portion 83. An anisotropic etch process can be performed to etch portions of the insulating cap layer 70 and the alternating stack (32, 44L) that underlie the line-shaped opening in the photoresist layer. Subsequently, the source-side sacrificial fill material portion 83 can be removed selective to the dielectric etch stop layer 12. A source-side trench 89 can be formed in the volume from which the materials of the insulating cap layer 70, the alternating stack (32, 44L), and the source-side sacrificial fill material portion 83 are removed.

Figures 5A, 5B, 5C:
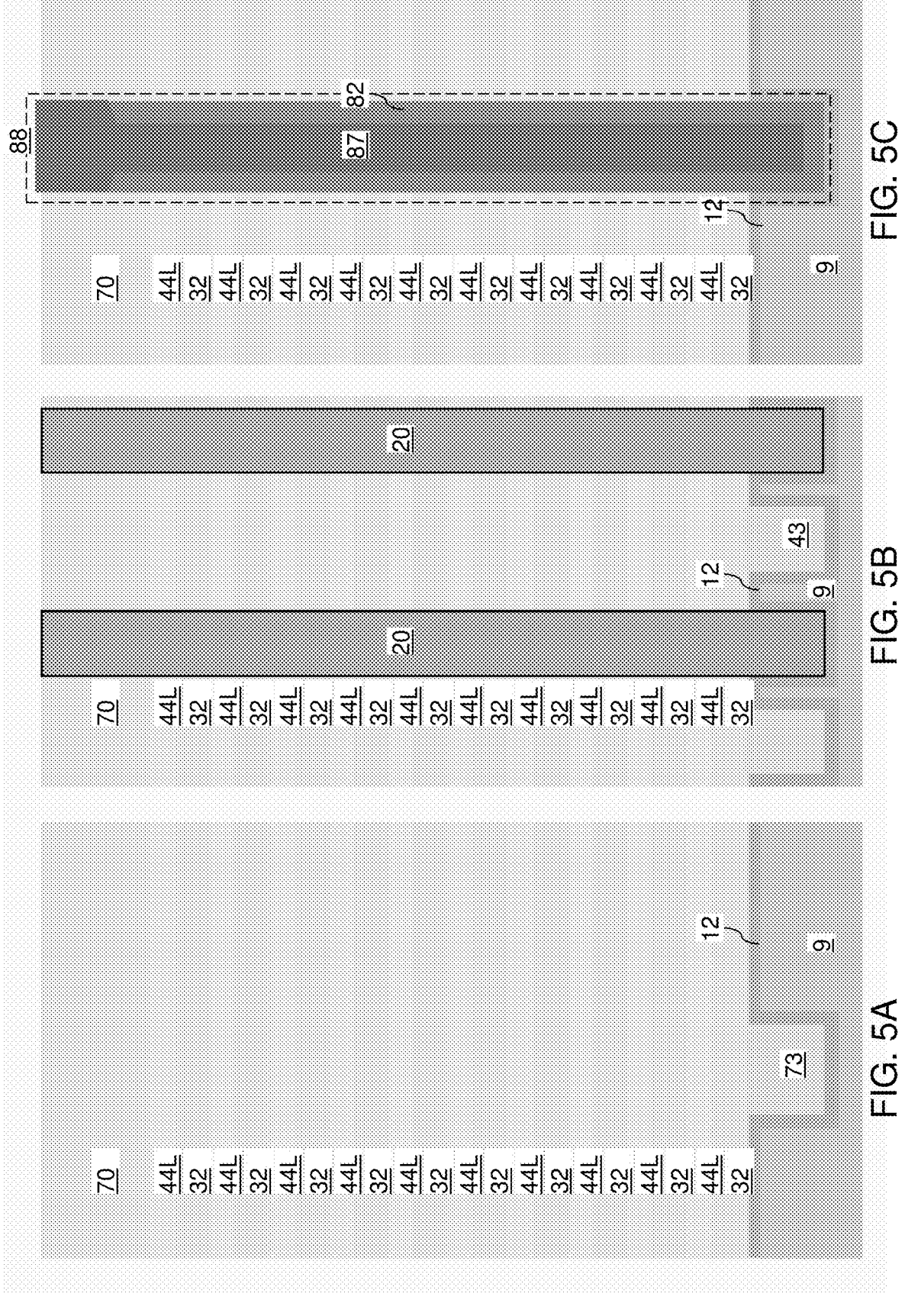
FIGS. 5A-5C are various views of the exemplary structure after formation of a source line according to an embodiment of the present disclosure. The locations of the cut planes for FIGS. 5A, 5B, and 5C correspond to the locations of the vertical planes A-A', B-B', and C-C' in FIG. 4D, respectively.

Referring to FIGS. 5A-5C, a doped semiconductor material having a doping of a second conductivity type can be conformally deposited to form a conformal doped semiconductor layer. The second conductivity type is the opposite of the first conductivity type. For example, if the first conductivity type is p-type, the second conductivity type is n-type, and vice versa. The atomic concentration of the dopants of the second conductivity type in the conformal doped semiconductor layer may be in a range from $5.0 \times 10^{18}/cm^3$ to $2.0 \times 10^{21}/cm^3$, such as from $1.0 \times 10^{19}/cm^3$ to $1.0 \times 10^{21}/cm^3$, although lesser and greater atomic concentrations may also be employed. The thickness of the conformal doped semiconductor layer may be less than one half of the width of the source-side trench 89 along the first horizontal direction hd1.

A top portion of the conformal doped semiconductor layer may be removed, for example, by depositing a sacrificial fill material (such as a photoresist material, a polymer material, or a carbon-based material) in a remaining volume of the source-side trench 89, by vertically recessing the sacrificial fill material such that the sacrificial fill material is removed from above the horizontal plane including the top surface of the insulating cap layer 70, and by isotropically etching the conformal doped semiconductor layer. The remaining portion of the conformal doped semiconductor layer after the isotropic etch process constitutes a doped semiconductor spacer 82. The doped semiconductor spacer 82 comprises vertically-extending portions (which are herein referred to as vertically-extending wall portions) and may comprise a horizontal bottom portion adjoined to the bottom of each vertically-extending portion. The sacrificial fill material can be subsequently removed, for example, by ashing or by a selective isotropic etch process.

At least one electrically conductive material (such as a combination of a metallic nitride barrier material and a high-electrical conductivity metal) can be deposited in the voids in the volume of the source-side trench 89. Excess portions of the at least one electrically conductive material can be removed from above the horizontal plane including the top surface of the insulating cap layer 70 by a planarization process such as a chemical mechanical polishing (CMP) process. The remaining portion of the at least one electrically conductive material constitutes an electrically conductive core 87. In one embodiment, the electrically conductive core 87 may comprise a electrically conductive barrier liner including a metallic nitride material (such as TiN, TaN, WN, and/or MoN) and an electrically conductive fill material (such as W, Co, Ru, Mo, Ti, Ta, Cu, etc.). The combination of the doped semiconductor spacer 82 and the electrically conductive core 87 constitutes a source line 88. The source line 88 vertically extending through each layer within the alternating stack (32, 44L), and may comprise a doped semiconductor spacer 82 comprising vertically-extending wall portions and contacting each layer within the alternating stack (32, 44L), and an electrically conductive core 87 contacting inner sidewalls of the doped semiconductor spacer 82.

Referring to FIGS. 6A-6E, an anneal process can be performed to induce diffusion of dopants of the second conductivity type (e.g., phosphorus or arsenic) from the doped semiconductor spacers 82 into adjoining portions of the semiconductor material layers 44L. A first region of each of the semiconductor material layers 44L can be converted into a source region 42 having a doping of the second conductivity type (e.g., n-type). A vertical stack of source regions 42 can be formed. Each source region 42 contacts and forms a respective first p-n junction with remaining portions of a respective one of the semiconductor material layers 44L. The average atomic concentration of dopants of the second conductivity type in the source regions 42 may be in a range from $1.0 \times 10^{18}/cm^3$ to $5.0 \times 10^{20}/cm^3$, such as from $1.0 \times 10^{19}/cm^3$ to $2.0 \times 10^{20}/cm^3$, although lesser and greater average atomic concentrations may also be employed. The lateral distance between the doped semiconductor spacers 82 and a respective most proximal p-n junction may be in a range from 20 nm to 200 nm, although lesser and greater lateral distances may also be employed.

A first contact-level dielectric layer 80 may be deposited over the insulating cap layer 70. The first contact-level dielectric layer 80 comprises a dielectric material, such as silicon oxide, and may have a thickness in a range from 30 nm to 200 nm, although lesser and greater thicknesses may also be employed.

A photoresist layer (not shown) can be applied over the first contact-level dielectric layer 80, and can be lithographically patterned to form rows of openings within the areas of the electrode-region sacrificial fill material portions 43. The rows of openings in the photoresist layer can be selected such that the areas of the openings are interlaced with the areas of the dielectric isolation pillar structures 20 along the first horizontal direction hd1. The combination of the areas of the openings in the photoresist layer and the areas of the dielectric isolation pillar structures 20 can collectively cover the entire area, or a predominant fraction of the entire area, of the electrode-region recesses 41 as formed at the processing steps described with reference to FIGS. 1A-1D.

An anisotropic etch process can be performed to transfer the pattern of the openings in the photoresist layer through portions of the first contact-level dielectric layer 80, the insulating cap layer 70, the alternating stack (32, 44L), and the dielectric isolation pillar structures 20 that are located within the areas of the openings in the photoresist layer. Further, remaining portions of the electrode-region sacrificial fill material portion 43 can be removed during or after the anisotropic etch process. The openings that are formed underneath the openings in the photoresist layer are herein referred to electrode openings.

Generally, the electrode openings can be formed through the alternating stack (32, 44L) such that electrode openings cut through peripheral portions of the dielectric isolation pillar structures 20. In one embodiment, each electrode opening may have a circular or oval horizontal cross-sectional shape. In this case, the electrode openings may have circular cylindrical shapes or elliptical cylindrical shapes. All sidewalls of the electrode openings may have a convex horizontal cross-sectional shape, and may be vertical or substantially vertical.

In one embodiment, each dielectric isolation pillar structure 20 located between a neighboring pair of electrode openings that are laterally spaced apart along the first horizontal direction hd1 can be etched at two peripheral portions such that two vertically-straight and horizontally-concave sidewalls are formed on the dielectric isolation pillar structure 20. As used herein, a vertically-straight sidewall refers to a sidewall having a straight vertical cross-sectional profile. As used herein, a horizontally-concave sidewall refers to a sidewall having a concave horizontal cross-sectional profile. As used herein, a horizontally-convex sidewall refers to a sidewall having a convex horizontal cross-sectional profile.

At least one dielectric layer and at least one electrode material comprising an electrically conductive material can be formed in each of the electrode openings. For example, a layer stack including a gate dielectric layer 56, a memory material layer 54, and a blocking dielectric layer 52 can be conformally deposited in a peripheral portion of each electrode opening. The gate dielectric layer 56 comprises a gate dielectric material, such as silicon oxide, silicon oxynitride, and/or a dielectric metal oxide. In one embodiment, the gate dielectric layer 56 comprises a tunneling dielectric material through which charge tunneling may occur under suitable electrical bias conditions. The memory material layer 54 may comprise any suitable memory material, such as a charge storage material, a ferroelectric memory material, a phase change memory material, etc. For example, the memory material layer 54 may comprise a silicon nitride charge storage layer, or a hafnium oxide based ferroelectric layer or a chalcogenide phase change layer, The blocking dielectric layer 52 comprises a blocking dielectric material that can block charge tunneling. For example, the blocking dielectric layer may comprise a silicon oxide layer and/or dielectric metal oxide layer, such as aluminum oxide.

At least one electrode material, such as a combination of an electrically conductive barrier liner material and an electrically conductive fill material, can be deposited in remaining voids in the electrode openings. Excess portions of the at least one electrode material and the layer stack can be removed from above the horizontal plane including the top surface of the first contact-level dielectric layer 80 by a planarization process, which may comprise a recess etch process and/or a chemical mechanical planarization process. Each remaining portion of the at least one electrode material constitutes an electrode 57.

The electrodes 57 comprise word line electrodes (e.g., control gate electrodes) 57W that function as portions of word lines for a three-dimensional memory array; source-select electrodes 57S that are employed to selectively activate horizontal semiconductor channels of the three-dimensional memory array from the source side, drain-select electrodes 57D that are employed to selectively activate the horizontal semiconductor channels of the three-dimensional memory array, and optional dummy electrodes 57A that operate in the same manner as the word line electrodes 57W but are not employed to access data due to the proximity of the dummy electrodes to the source-select electrodes or to the drain-select electrodes. Each remaining portion of the layer stack is herein referred to as a memory film 50 if formed around a word line electrode 57W. Each remaining portion of the layer stack is herein referred to as a layer stack 50' if formed around an electrode 57A, 57D or 57S that is not a word line electrode 57W. Each contiguous combination of an electrode 57 and a memory film 50 or a layer stack 50' constitutes a laterally-insulated electrode structure 58.

Each semiconductor material layer 44L is converted into a vertically-perforated semiconductor layer (44, 42) that includes a plurality of source regions 42 and a first-conductivity-type semiconductor layer 44. Each insulating layer 32 includes a plurality of elongated perforations therethrough, and each vertically-perforated semiconductor layer (44, 42) includes a plurality of elongated perforations therethrough. Each perforation through the insulating layers 32 and the vertically-perforated semiconductor layers (44, 42) is elongated along the first horizontal direction hd1, has a lateral width undulation along the second horizontal direction hd2, and contains and laterally surrounds a respective laterally alternating sequence (58, 20) of laterally-insulated electrode structures 58 and dielectric isolation pillar structures 20. Generally, laterally alternating sequences (58, 20) of laterally-insulated electrode structures 58 and dielectric isolation pillar structures 20 can be formed through the alternating stack of insulating layers 32 and semiconductor material layers which are the vertically-perforated semiconductor layers (44, 42).

Thus, the alternating stack of insulating layers 32 and semiconductor material layers 44L is converted into a vertically alternating sequence {32, (44, 42)} of vertically-perforated insulating layers 32 and vertically-perforated semiconductor layers (44, 42). A plurality of elongated openings vertically extends through each of the vertically-perforated insulating layers 32 and the vertically-perforated semiconductor layers (44, 42) in the vertically alternating sequence {32, (44, 42)}. Each of the laterally alternating sequences (58, 20) is located within a respective elongated opening among the plurality of elongated openings. A respective subset of the laterally-insulated electrode structures 58 and a respective subset of the dielectric isolation pillar structures 20 laterally alternate along the first horizontal direction hd1 within each of the laterally alternating sequences (58, 20).

In one embodiment, each of the laterally-insulated electrode structures 58 vertically extends through each of the vertically-perforated insulating layers 32 and each of the vertically-perforated semiconductor layers (44, 42) in the vertically alternating sequence {32, (44, 42)}. In one embodiment, each of the vertically-perforated insulating layers 32 contacts each of the laterally-insulated electrode structures 58 and each of the dielectric isolation pillar structures 20.

Figures 6A, 6B, 6C:
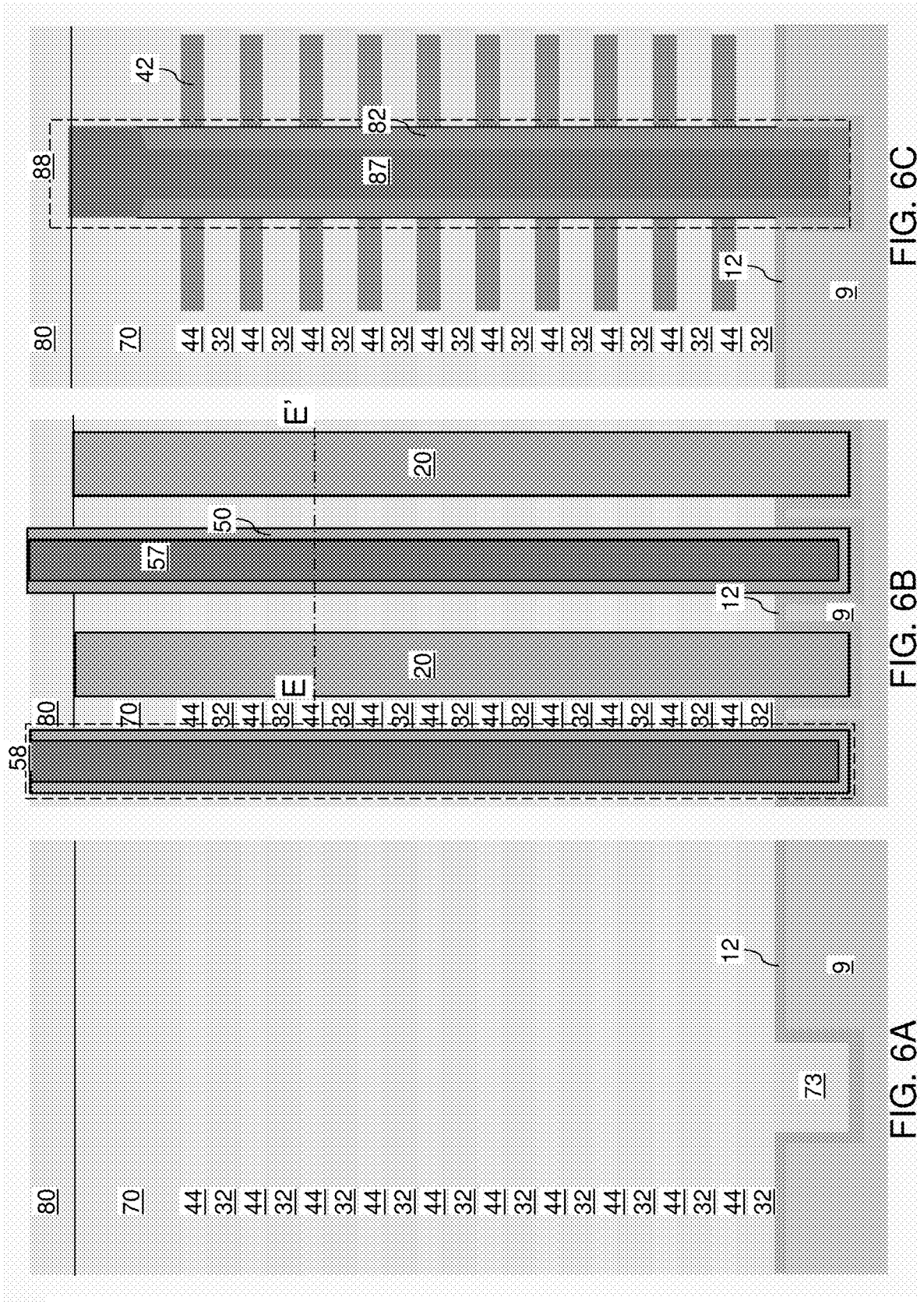
FIGS. 6A-6E are various views of the exemplary structure after formation of laterally-insulated electrode structures according to an embodiment of the present disclosure.
Figure 6D:
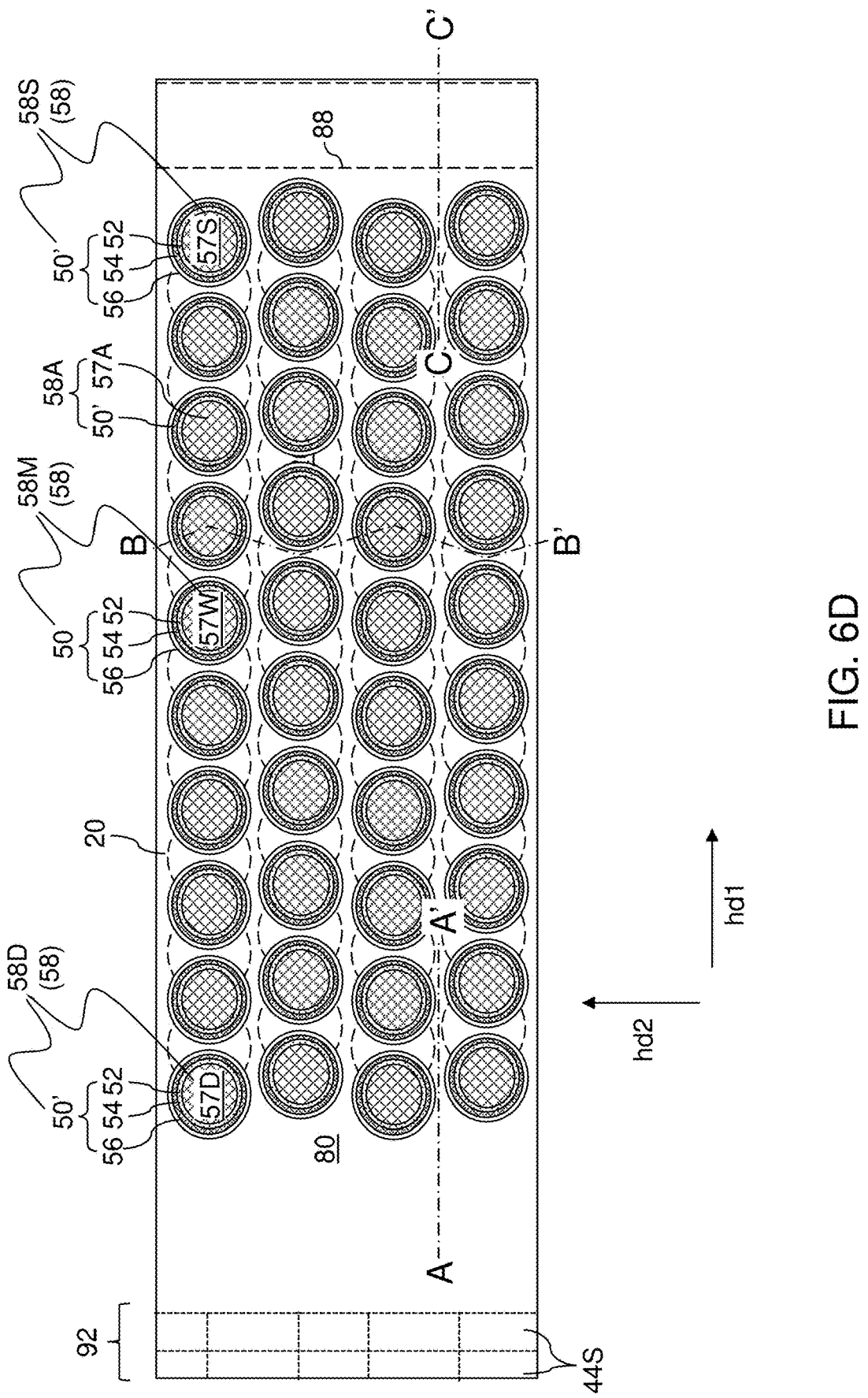
Figure 6E:
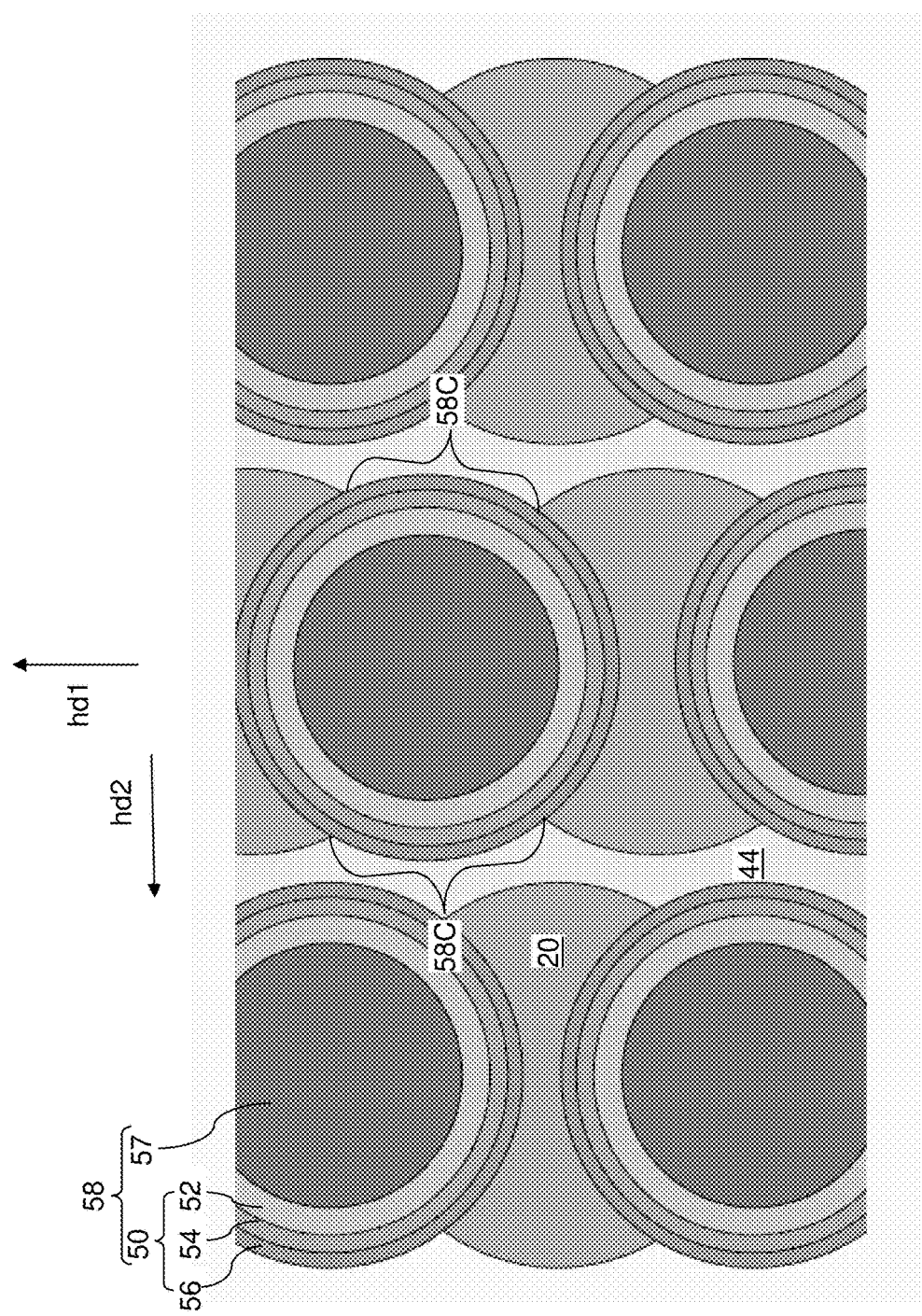

In one embodiment shown in FIG. 6E, each of the laterally-insulated electrode structures 58 comprises two vertical stacks of outer surface segments 58C contacting surface segments of the vertically-perforated semiconductor layers (44, 42). In one embodiment, each outer surface segment within the two vertical stacks of outer surface segments 58C comprises a vertically-straight and laterally convex-surface segment; and each surface segment of the vertically-perforated semiconductor layers (44, 42) that contacts a respective laterally-insulated electrode structure 58 comprises a vertically-straight and laterally-concave surface segment.

A first subset of the laterally-insulated electrode structures 58 each including a memory film 50 and a word line electrode 58W is herein referred to as memory pillar structures 58M. As such, each memory pillar structure 58M comprises a memory film 50 and a word line electrode 57W (which is one of the electrodes 57). The memory film 50 may comprise, from outside to inside, a gate dielectric layer 56, a memory material layer 54, and a blocking dielectric layer 52. A second subset of the laterally-insulated electrode structures 58 comprises insulated drain-select pillar structures 58D including a layer stack 50' having a same composition as the memory film 50 and further including a drain select electrode 57D (which is one of the electrodes 57). A third subset of the laterally-insulated electrode structures 58 comprises insulated source-select pillar structures 58S including a layer stack 50' having a same composition as the memory film 50 and further including a source select electrode 57D (which is one of the electrodes 57). A fourth subset of the laterally-insulated electrode structures 58 comprises insulated dummy memory pillar structures 58A including a layer stack 50' having a same composition as the memory film 50 and further including a dummy electrode 57A (which is one of the electrodes 57).

In one embodiment, each of the vertically-perforated semiconductor layers (44, 42) comprises a respective source region 42 contacting and forming a respective first p-n junction with an end of a first-conductivity-type semiconductor layer 44. In one embodiment, a source region 42 may contact a plurality of surface segments of a first-conductivity-type semiconductor layer 44 that are laterally spaced apart from each other along the second horizontal direction hd2. Each first-conductivity-type semiconductor layer 44 may have a plurality of strip regions located between neighboring pairs of laterally alternating sequences (58, 20) of laterally-insulated electrode structures 58 and dielectric isolation pillar structures 20, and having a width undulation.

Subsequently, a staircase region 92 including horizontal steps 44S may be formed on the opposite side of the alternating sequences (58, 20) from the source line 88. The staircase region 92 may be formed by any suitable photolithography and etching process.

Figures 7A, 7B, 7C:
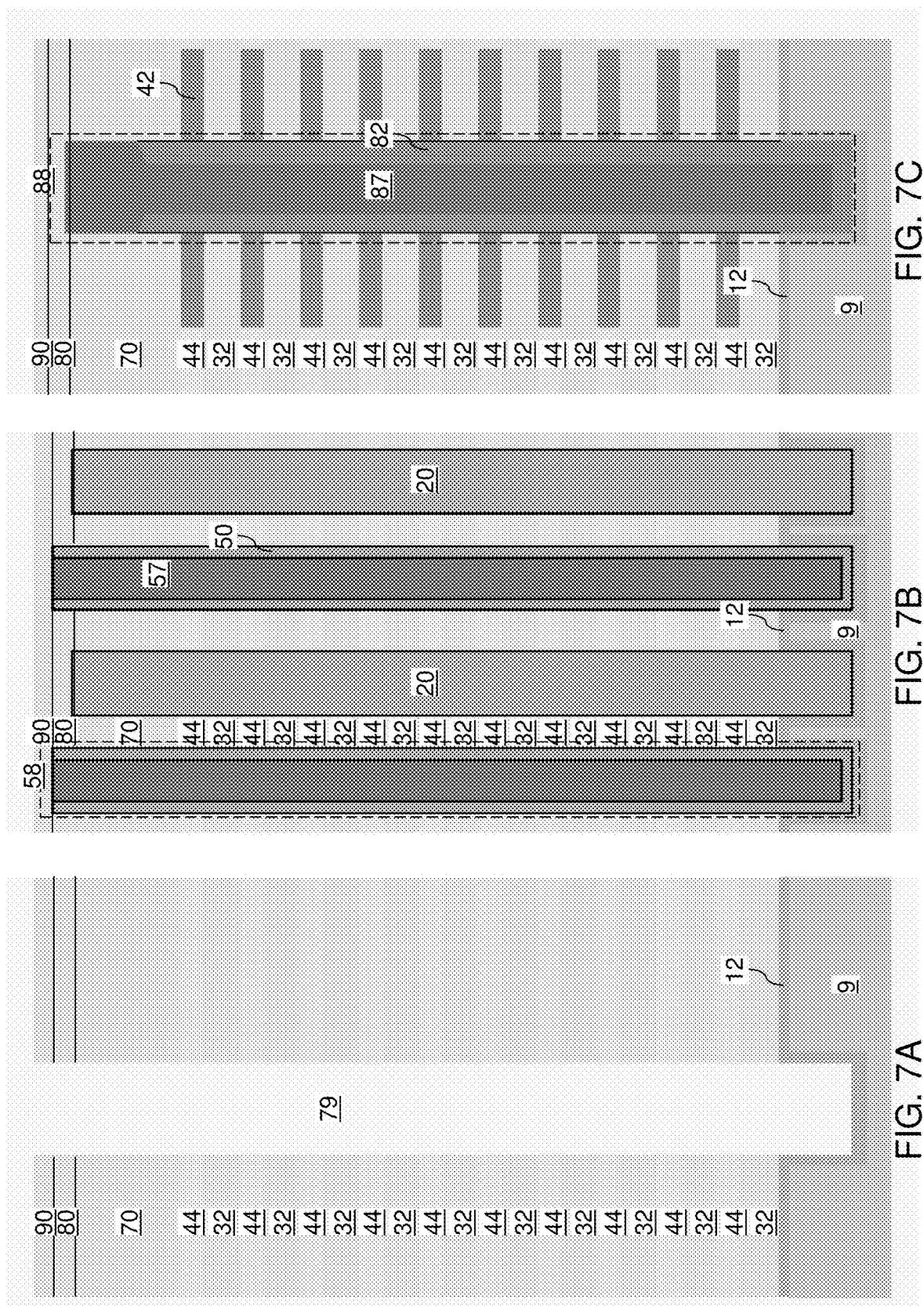
FIGS. 7A-7C are various views of the exemplary structure after formation of a drain-side trench according to an embodiment of the present disclosure. The locations of the cut planes for FIGS. 7A, 7B, and 7C correspond to the locations of the vertical planes A-A', B-B', and C-C' in FIG. 6D, respectively.

Referring to FIGS. 7A-7C, a second contact-level dielectric layer 90 can be formed over the first contact-level dielectric layer 80. The second contact-level dielectric layer 90 comprises a dielectric material such as silicon oxide. The thickness of the second contact-level dielectric layer 90 may be in a range from 30 nm to 200 nm, although lesser and greater thicknesses may also be employed.

A photoresist layer (not shown) can be applied over the second contact-level dielectric layer 90, and can be lithographically patterned to form a line-shaped opening within the area of the drain-side sacrificial fill material portion 73. An anisotropic etch process can be performed to etch portions of the contact-level dielectric layers (80, 90), the insulating cap layer 70, and the alternating stack {32, (44, 42)} that underlie the line-shaped opening in the photoresist layer. Subsequently, the drain-side sacrificial fill material portion 73 can be removed selective to the dielectric etch stop layer 12. A drain-side trench 79 can be formed in the volume from which the materials of the contact-level dielectric layers (80, 90), the insulating cap layer 70, the alternating stack {32, (44, 42)}, and the drain-side sacrificial fill material portion 73 are removed.

Referring to FIGS. 8A-8D, a selective isotropic etch process that etches the material of the first-conductivity-type semiconductor layers 44 selective to the materials of the vertically-perforated insulating layers 32, the dielectric etch stop layer 12, the insulating cap layer 70, and the contact-level dielectric layers (80, 90) can be performed. In this case, an isotropic etchant that etches the material of the first-conductivity-type semiconductor layers 44 selective to the materials of the vertically-perforated insulating layers 32, the dielectric etch stop layer 12, the insulating cap layer 70, and the contact-level dielectric layers (80, 90) can be introduced into the drain-side trench 79. For example, if the first-conductivity-type semiconductor layers 44 comprises silicon (e.g., polysilicon), a wet etch process using hot trimethyl-2 hydroxyethyl ammonium hydroxide ("hot TMY") or tetramethyl ammonium hydroxide ("TMAH") may be used to laterally recess the physically exposed sidewalls of the first-conductivity-type semiconductor layers 44 around the drain-side trench 79. Lateral recesses 47 are formed around the drain-side trench 79 in each volume from which the material of the first-conductivity-type semiconductor layers 44 is removed.

Figures 8A, 8B, 8C:
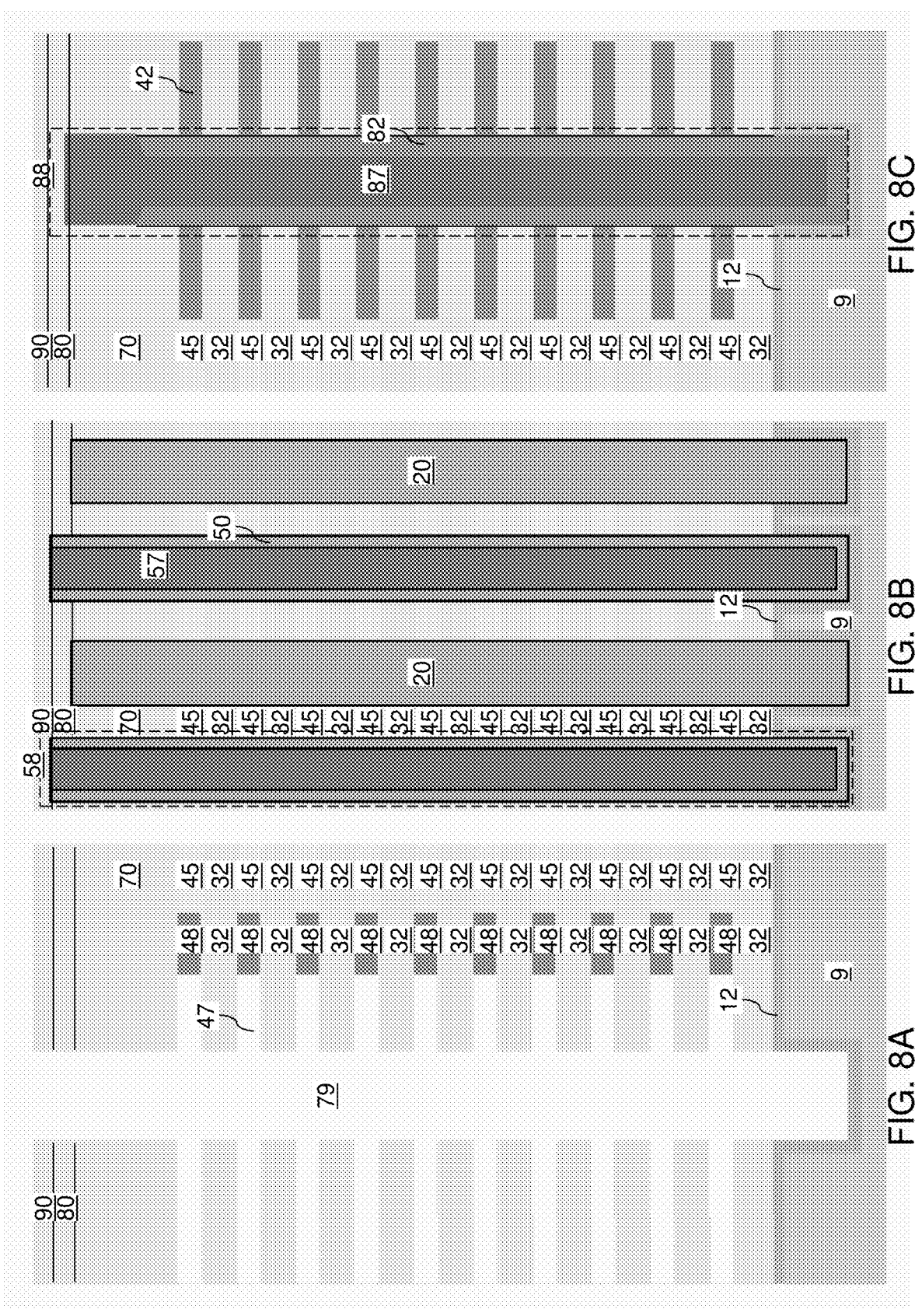
FIGS. 8A-8D are various views of the exemplary structure after formation of lateral recesses and drain regions according to an embodiment of the present disclosure. The locations of the cut planes for FIGS. 8A, 8B, and 8C correspond to the locations of the vertical planes A-A', B-B', and C-C' in FIG. 8D, respectively.
Figure 8D:
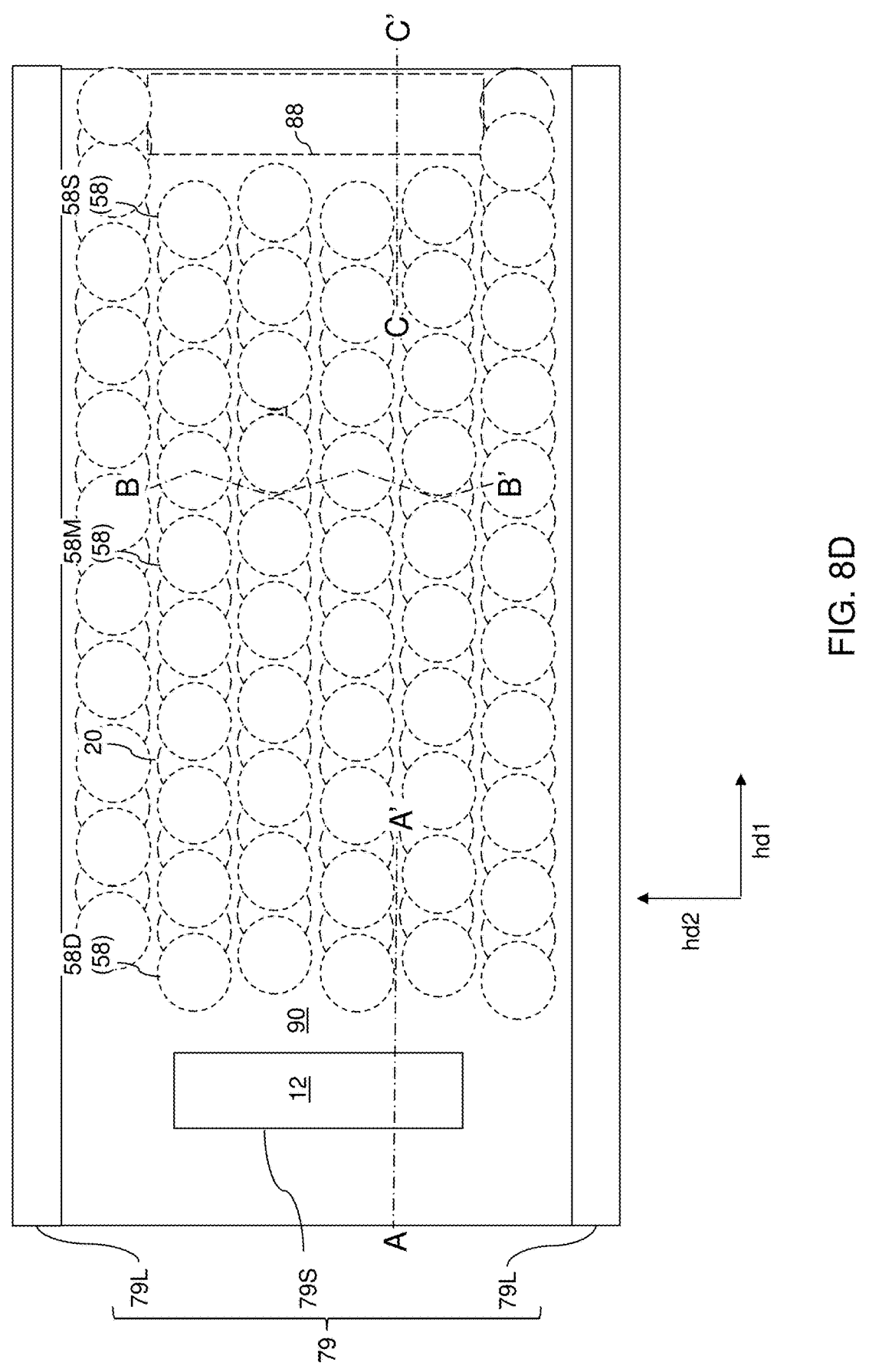

In one embodiment shown in FIG. 8D, the drain-side trench 79 may include multiple longer laterally-extending portions 79L that laterally extend along the first horizontal direction hd1 and one or more separate shorter portions 79S that laterally extend along the second horizontal direction hd2. In this case, portions of the first-conductivity-type semiconductor layers 44 may be entirely removed between neighboring pairs of the longer laterally-extending portions 79L that laterally extend along the first horizontal direction hd1. Furthermore, portions of the first-conductivity-type semiconductor layers 44 may be cut along the first horizontal direction hd1 around each of the shorter portions 79S of the drain-side trench 79 that laterally extend along the second horizontal direction hd2. Thus, the first-conductivity-type semiconductor layers 44 do not extend along the first horizontal direction hd1 past the shorter portions 79S of the drain-side trench 79. The lateral recess distance of the selective isotropic etch process may be in a range from 50 nm to 400 nm, such as from 100 nm to 240 nm, although lesser and greater lateral recess distances may also be employed. The remaining portions of the first-conductivity-type semiconductor layers 44 are subsequently employed as horizontal semiconductor channels, and are herein referred to as horizontal semiconductor channel strips 45.

Drain regions 48 can be formed on or within surface portions of the horizontal semiconductor channel strips 45. In one embodiment, a selective semiconductor deposition process can be performed to selectively deposit a doped semiconductor material having a doping of the second conductivity type, such as n-type polysilicon. A selective semiconductor deposition process is a semiconductor deposition process that grows a semiconductor material from physically exposed semiconductor surfaces while suppressing deposition of the semiconductor material from dielectric surfaces. Specifically, the drain regions 48 comprising a doped semiconductor material having a doping of the second conductivity type can grow only from the physically exposed sidewalls of the horizontal semiconductor channel strips 45.

Alternatively, the drain regions 48 may be formed by doping the exposed end portions of the semiconductor channel strips 45 in the lateral recesses 47. Specifically, a gas phase dopant, such as phosphine or arsine may be provided into the lateral recesses 47 through the drain-side trenches 79 to dope exposed end portions of the semiconductor channel strips 45 in the lateral recesses 47.

A plurality of drain regions 48 that are laterally spaced apart can be formed at each level of the horizontal semiconductor channel strips 45, i.e., between each vertically neighboring pair of a vertically-perforated insulating layers 32, or between the topmost vertically-perforated insulating layer 32 and the insulating cap layer 70. The plurality of drain regions 48 form second p-n junctions with the horizontal semiconductor channel strips 45. The atomic concentration of the dopants of the second conductivity type in the drain regions 48 may be in a range from $5.0 \times 10^{18}/cm^3$ to $2.0 \times 10^{21}/cm^3$, such as from $1.0 \times 10^{19}/cm^3$ to $1.0 \times 10^{21}/cm^3$, although lesser and greater atomic concentrations may also be employed. The lateral extent of each drain region 48 may be in a range from 30 nm to 300 nm, such as from 60 nm to 150 nm, although lesser and greater lateral extents may also be employed.

Figures 9A, 9B, 9C:
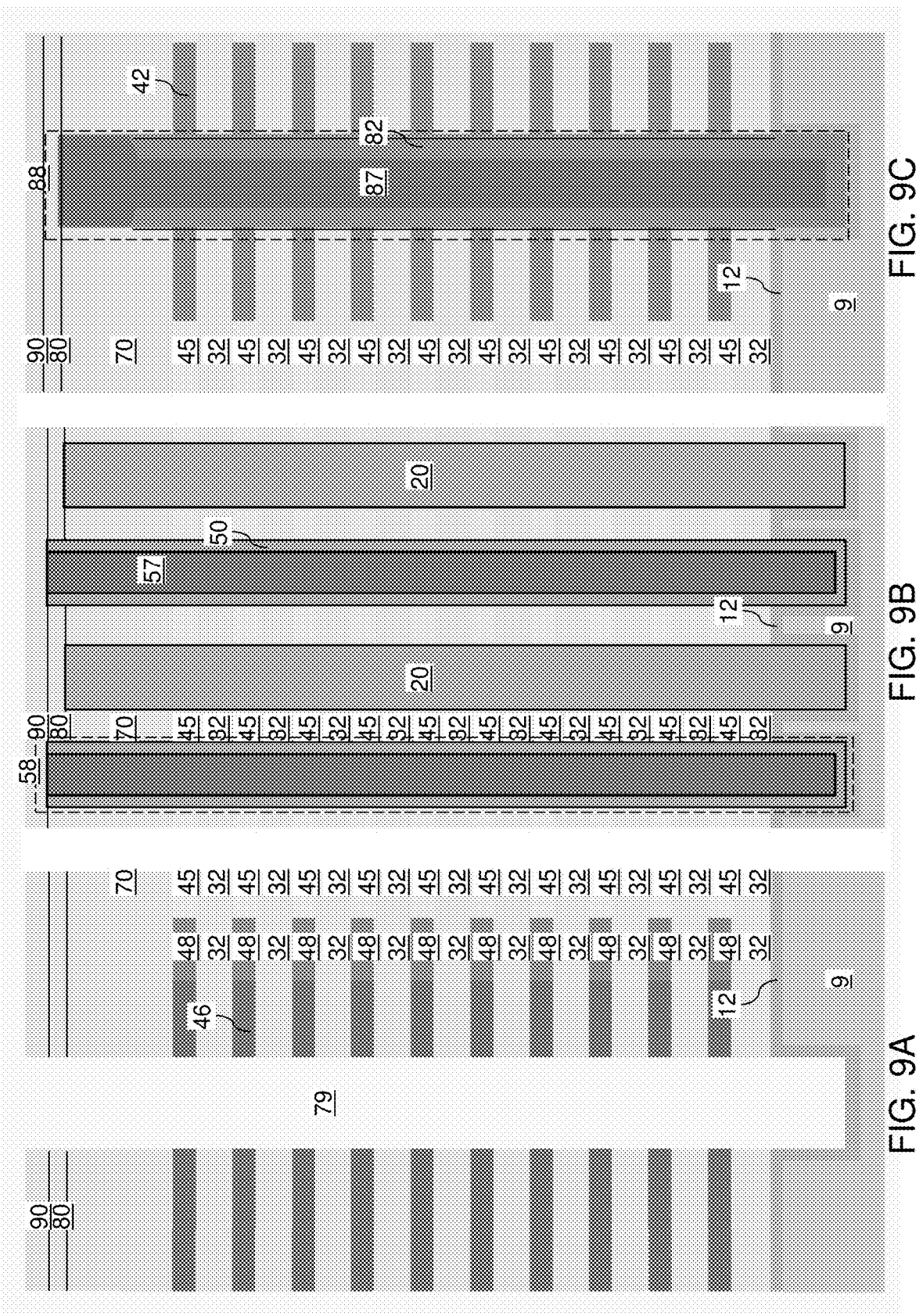
FIGS. 9A-9C are various views of the exemplary structure after formation of electrically conductive layers according to an embodiment of the present disclosure. The locations of the cut planes for FIGS. 9A, 9B, and 9C correspond to the locations of the vertical planes A-A', B-B', and C-C' in FIG. 8D, respectively.
Figures 10A, 10B, 10C:
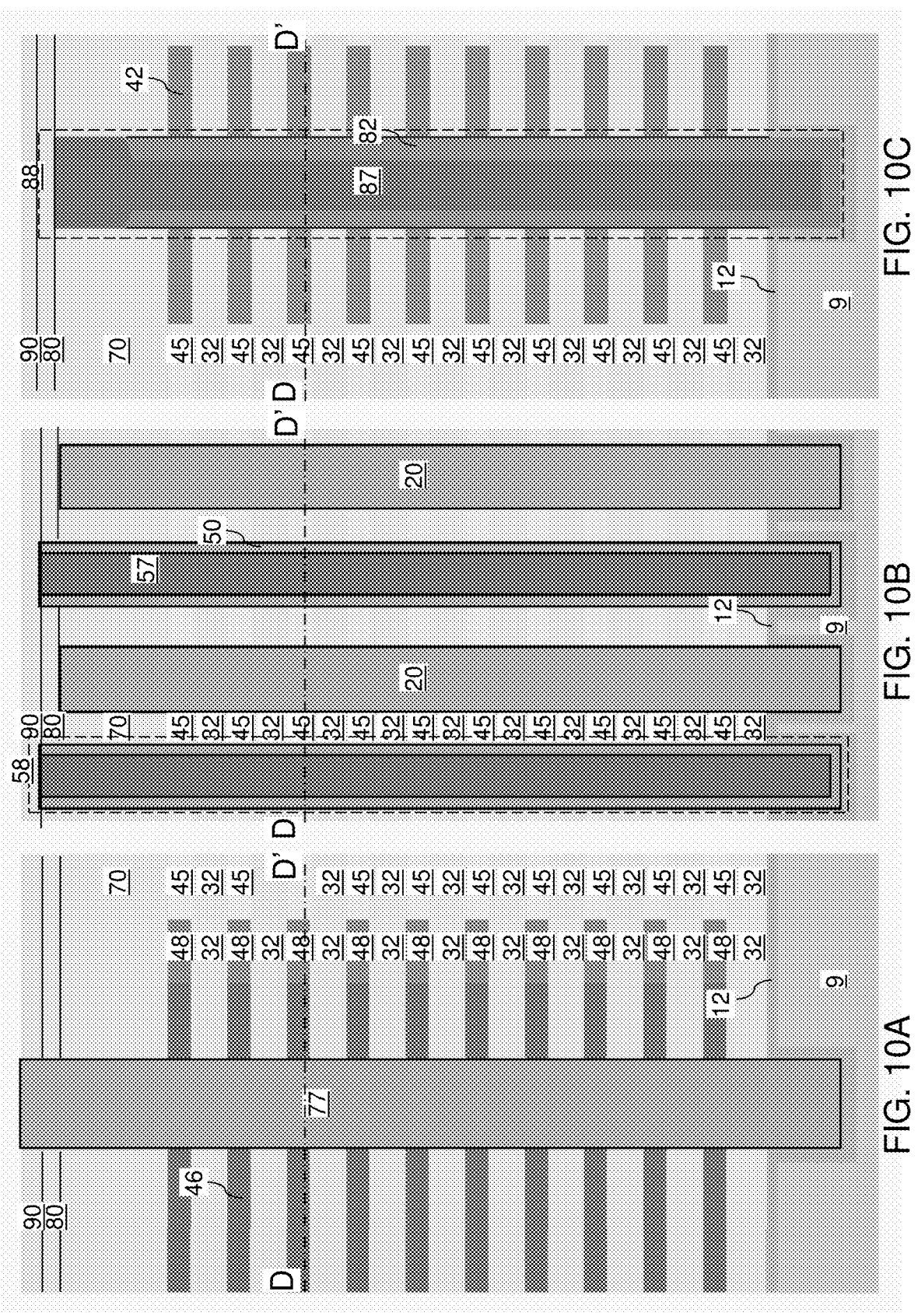
FIGS. 10A-10D are various views of the exemplary structure after formation of a trench fill structure according to an embodiment of the present disclosure.
Figure 10D:
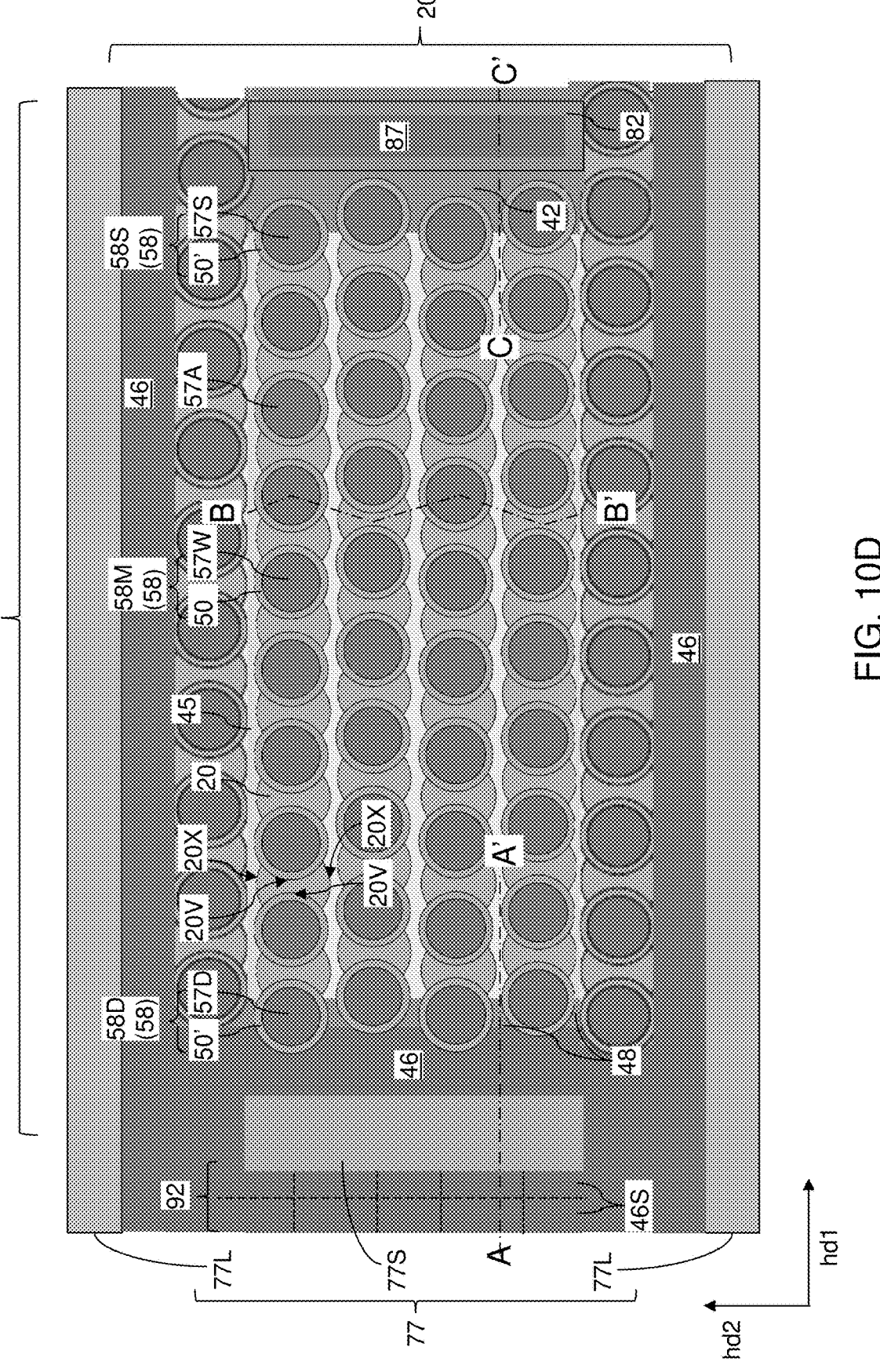

Referring to FIGS. 9A-9C, at least one electrically conductive material (such as a combination of a metallic nitride barrier material and a high-electrical conductivity metal) can be conformally deposited in remaining volume of the lateral recesses 47, in peripheral portions of the drain-side trench 79, and over the contact-level dielectric layers (80, 90). Portions of the at least one electrically conductive material located above the contact-level dielectric layers (80, 90) or inside the drain-side trench 79 can be removed by performing an etch back process, which may comprise an anisotropic etch process or an isotropic etch process. Each remaining portion of the at least one electrically conductive material that fills the lateral recesses 47 constitutes an electrically conductive layer 46. In one embodiment, the electrically conductive layers 46 may comprise a metallic barrier liner including a metallic nitride material (such as TiN, TaN, WN, and/or MoN) and a metal fill material (such as W, Co, Ru, Mo, Ti, Ta, Cu, etc.). The portions of the electrically conductive material located at a vertical same level (e.g., between a vertically neighboring pair of vertically-perforated insulating layers 32) can be interconnected among one another to provide an electrically conductive layer 46 which is a single continuous structure, as shown in FIG. 10D and described below. Generally, portions of the vertically-perforated semiconductor layers 44 can be replaced with electrically conductive layers 46. Each electrically conductive layer 46 may comprise a bit line which contacts drain regions 48 located at the same vertical level above the substrate 9. The electrically conductive layers 46 include horizontal stepped surfaces 46S in the staircase region 92.

Each contiguous combination of a source region 42, a plurality of horizontal semiconductor channel strips 45, drain regions 48, and an electrically conductive layer 46 constitutes a composite layer having a uniform thickness and having vertical perforations therethrough. Each such contiguous combination is herein referred to as a vertically-perforated composite layer (45, 42, 48, 46). A vertically alternating sequence {32, (45, 42, 48, 46)} of vertically-perforated insulating layers 32 and vertically-perforated composite layers (45, 42, 48, 46) is formed over the substrate 9. A plurality of elongated openings vertically extends through each of the vertically-perforated insulating layers 32 and the vertically-perforated composite layers (45, 42, 48, 46) in the vertically alternating sequence {32, (45, 42, 48, 46)}. Each of the vertically-perforated composite layers (45, 42, 48, 46) comprises a respective plurality of horizontal semiconductor channel strips 45 located between each neighboring pair of the elongated openings. The elongated openings are filled with the alternating laterally alternating sequence (58, 20) of laterally-insulated electrode structures 58 and dielectric isolation pillar structures 20. Each elongated opening comprises a plurality of vertically-straight and laterally-concave surface segments that vertically extend through each layer within the vertically alternating sequence {32, (45, 42, 48, 46)} and through the insulating cap layer 70.

In summary, the laterally alternating sequences (58, 20) of laterally-insulated electrode structures 58 and dielectric isolation pillar structures 20 are located in the elongated openings through the vertically alternating sequence {32, (45, 42, 48, 46)}. Each of the laterally alternating sequences (58, 20) is located within a respective one of the elongated openings. A respective subset of the laterally-insulated electrode structures 58 and a respective subset of the dielectric isolation pillar structures 20 laterally alternate along the first horizontal direction hd1 within each of the laterally alternating sequences (58, 20).

In one embodiment, each of the vertically-perforated composite layers (45, 42, 48, 46) comprises a respective source region 42 contacting and forming a respective first p-n junction with a first end of each of the horizontal semiconductor channel strips 45. In one embodiment, each of the vertically-perforated composite layers (45, 42, 48, 46) also comprises a respective plurality of drain regions 48. Each of the plurality of drain regions 48 contacts and forms a second p-n junction with a second end of a respective one of the horizontal semiconductor channel strips 45.

Referring to FIGS. 10A-10D, a dielectric fill material, such as silicon oxide, can be deposited in the drain-side trench 79 to form a trench fill structure 77. Excess portions of the dielectric fill material may, or may not, be removed from above the contact-level dielectric layers (80, 90). The trench fill structure 77 comprises and/or consists essentially of the dielectric fill material. The trench fill structure 77 may include multiple longer laterally-extending portions 77L that laterally extend along the first horizontal direction hd1 and one or more separate shorter portions 77S that laterally extend along the second horizontal direction hd2, as shown in FIG. 10D.

In one embodiment, the plurality of drain regions 48 are laterally spaced from each other along the second horizontal direction hd2 by the laterally alternating sequences (58, 20) of laterally-insulated electrode structures 58 and dielectric isolation pillar structures 20, as shown in FIG. 10D. In one embodiment, each of the vertically-perforated composite layers (45, 42, 48, 46) comprises a single respective electrically conductive layer 46 in contact with sidewalls of the respective plurality of drain regions 48.

FIG. 10D shows one memory block 100, which is a portion of a memory finger 200. The electrically conductive layers (e.g., bit lines) 46 surround the laterally alternating sequences (58, 20) of laterally-insulated electrode structures 58 and dielectric isolation pillar structures 20 and the horizontal semiconductor channel strips 45 which alternate in the second horizontal direction in the memory block 100. In each memory finger 200, the electrically conductive layers 46 are electrically isolated from the source regions 42 and the horizontal semiconductor channel strips 45 by the end rows dielectric pillar structures 20 and the memory films 50 or layer stacks 50' located at the outer peripheries of the laterally-insulated electrode structures 58. Thus, as shown in FIG. 10D, the first and sixth rows laterally alternating sequences (58, 20) electrically isolated the electrically conductive layers 46 from the source regions 42 and the horizontal semiconductor channel strips 45. The longer laterally-extending portions 77L of the trench fill structure 77 laterally isolate neighboring memory fingers 200 along the second horizontal direction hd2.

In one embodiment shown in FIG. 10D, at least one of the dielectric isolation pillar structures 20 comprises: a pair of vertically-straight and laterally-convex surface segments 20X contacting two vertical stacks of horizontal semiconductor channel strips 45, and a pair of vertically-straight and laterally-concave surface segments 20V contacting a neighboring pair of the laterally-insulated electrode structures 58.

Figures 11A, 11B, 11C:
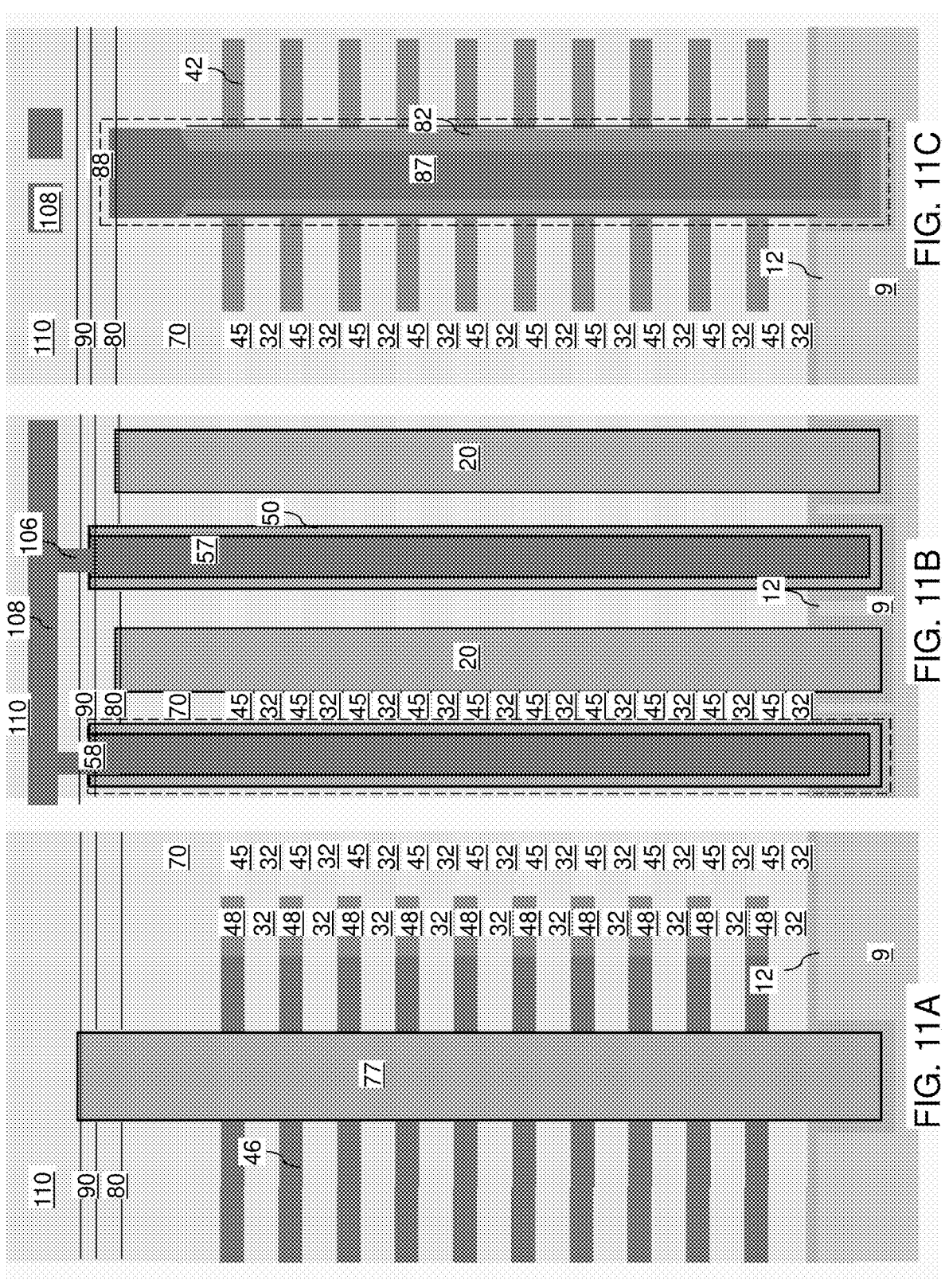
FIGS. 11A-11G are various views of the exemplary structure after formation of electrode-contact via structures, word-line metal lines, connection via structures, and upper metal lines according to an embodiment of the present disclosure. The vertical planes A-A', B-B', and C-C' in FIG. 10D are cut planes for FIG. 11A, FIG. 11B, and FIG. 11C, respectively.
Figure 11D:
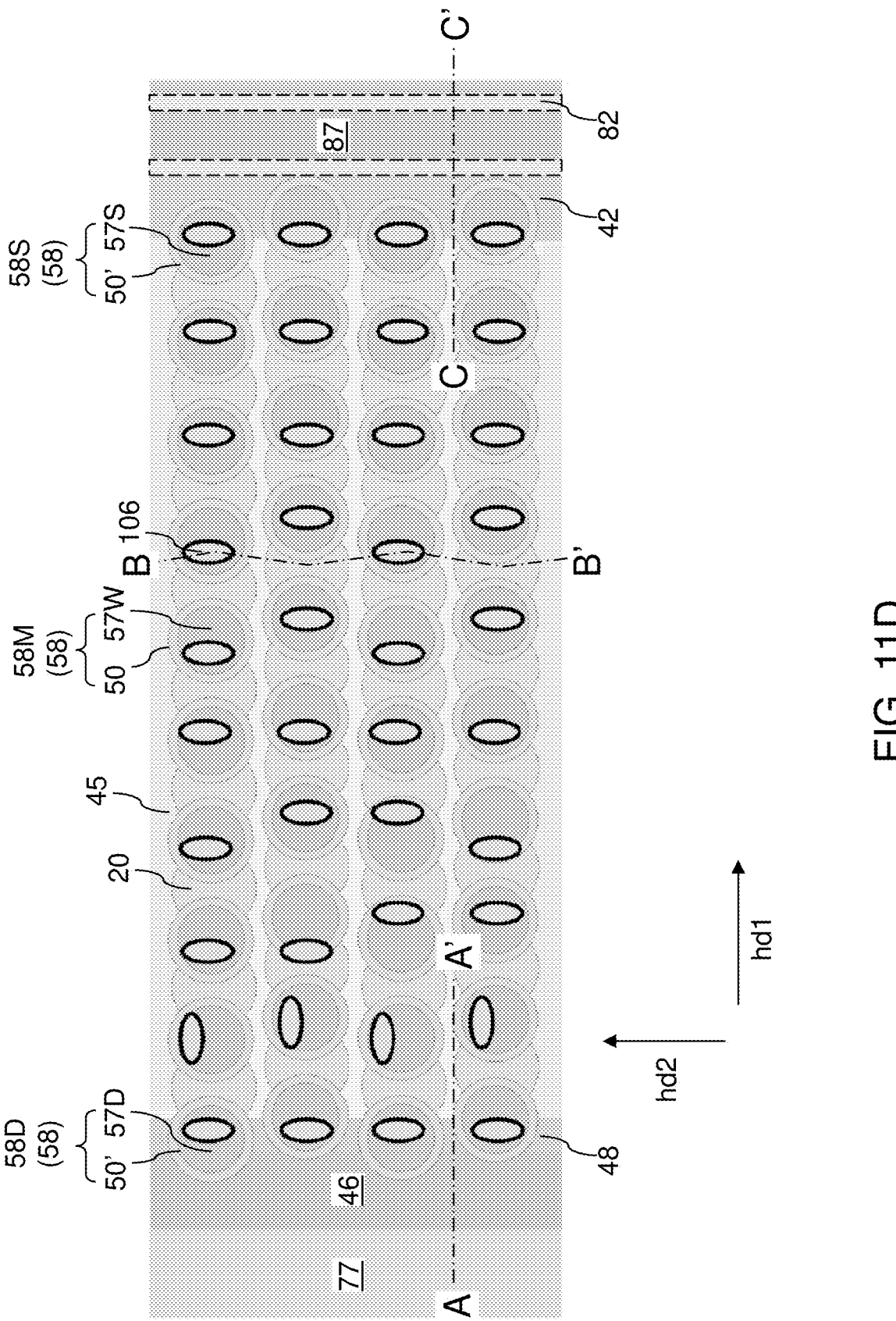

Referring to FIGS. 11A-11G, various contact via structures, metal interconnect structures, and additional dielectric material layer can be subsequently formed to provide electrical wiring to the electrically conductive layers 46 and the electrodes 57. The contact via structures may comprise electrode-contact via structures 106 and layer contact via structures (not illustrated) that contact a respective one of the electrically conductive layers 46, as shown in FIG. 11D. In one embodiment, a line-level dielectric layer 110 may be formed above the contact-level dielectric layers (80, 90), and the electrode-contact via structures 106 may be formed through a lower portion of the line-level dielectric layer 110 and through the second contact-level dielectric layer 90.

Figure 11E:
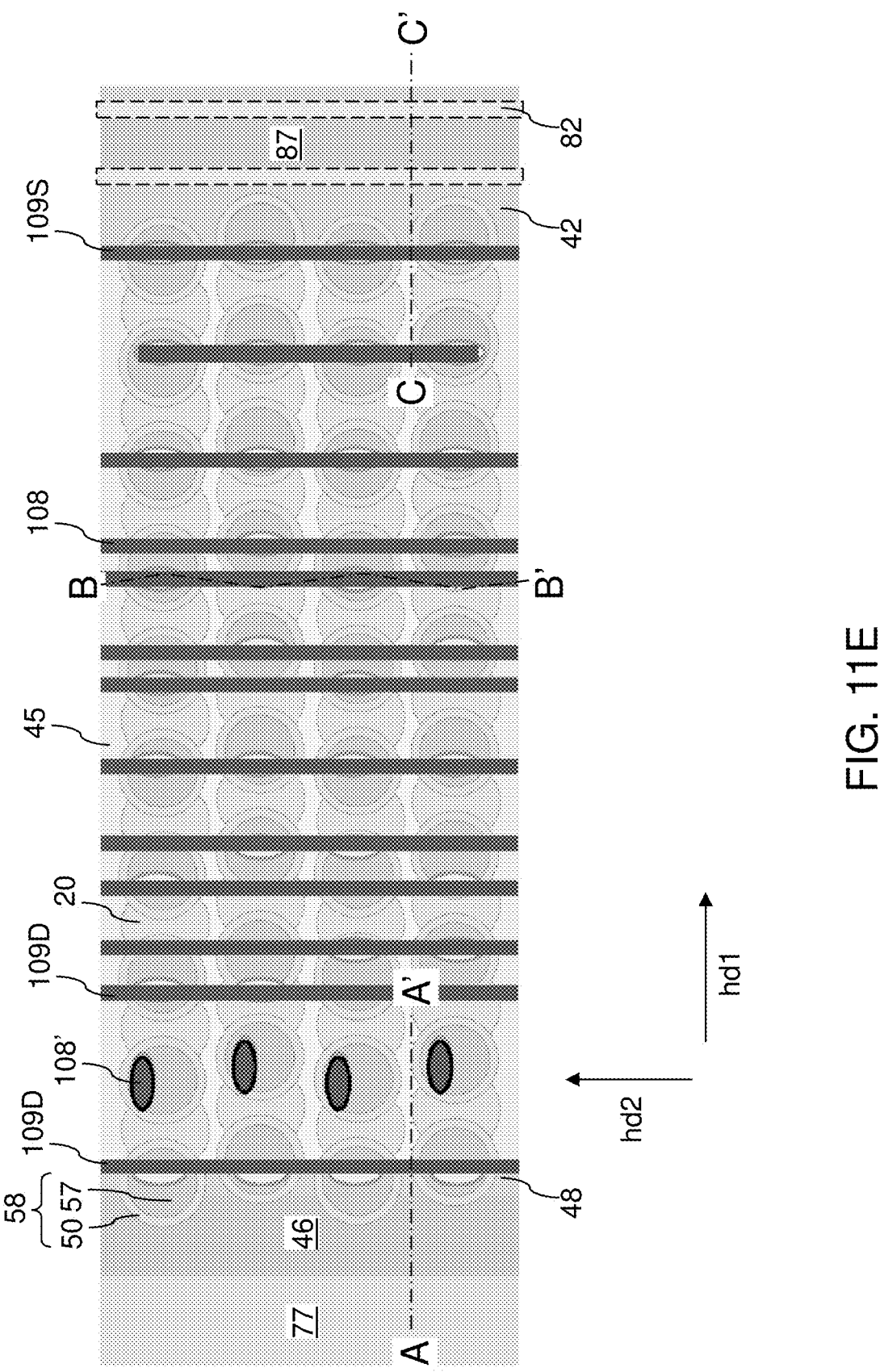

Word-line metal lines 108 may be formed in an upper portion of the line-level dielectric layer 110 on a respective subset of the electrode-contact via structures 106 that contact word line electrodes, as shown in FIGS. 11B and 11E. Generally, the word-line metal lines 108 may be formed in any configuration that is suitable for selectively activating portions of the horizontal semiconductor channel strips 45. In one embodiment, the word-line metal lines 108 may laterally extend along the second horizontal direction hd2 and can be electrically connected to every other word line electrode 57W along the second horizontal direction. Source-select metal lines 109S can be electrically connected to a respective subset of the source-select electrodes 57S. Drain-select metal lines 109D can be electrically connected to a respective subset of the drain-select electrodes 57D. Connection metal pads 108' can be formed over a subset of the electrode-contact via structures 106 which electrically contact second to last drain-select electrodes (e.g., SGD2 electrodes) 57D at the same level as the word-line metal lines 108.

Figure 11F:
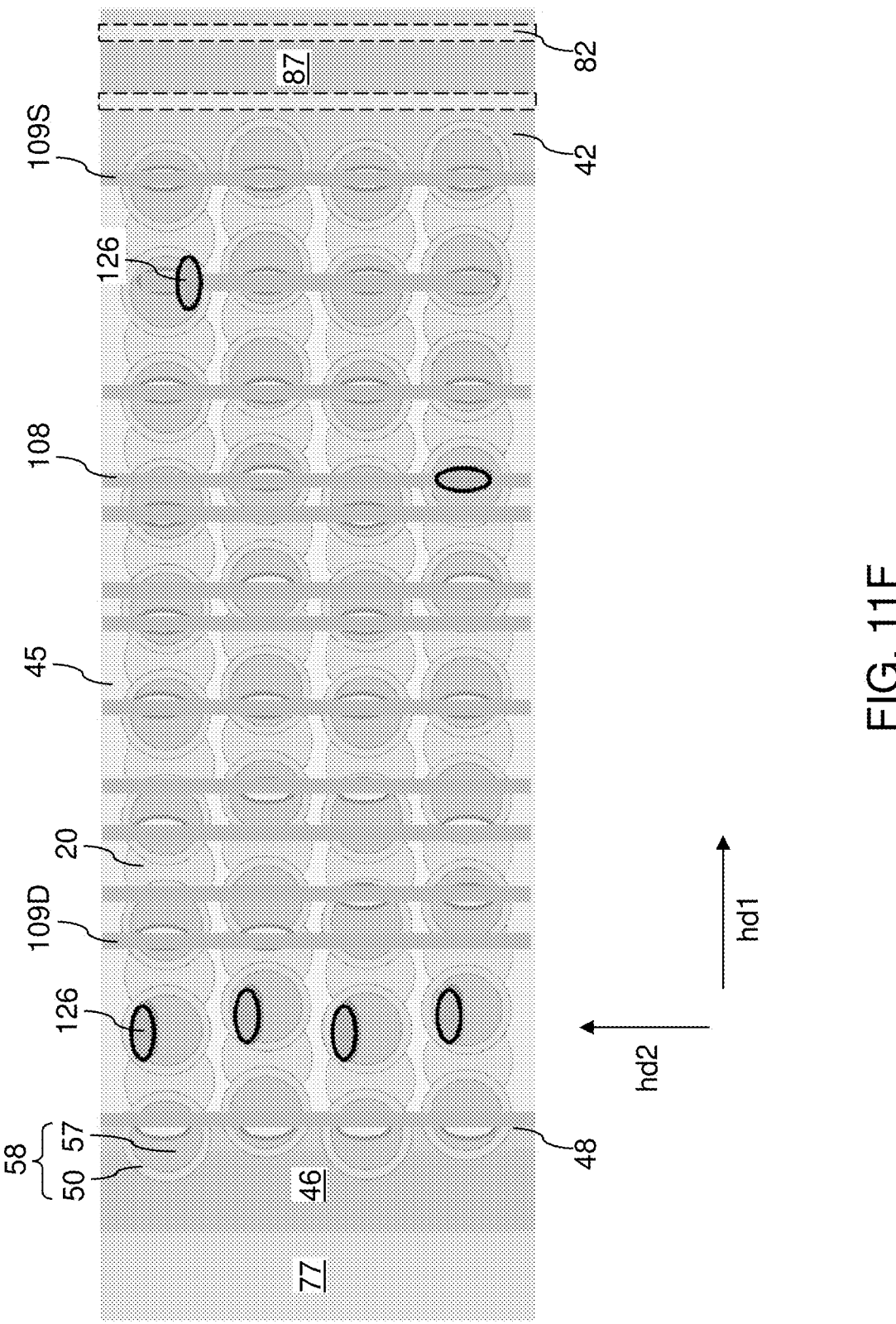
Figure 11G:
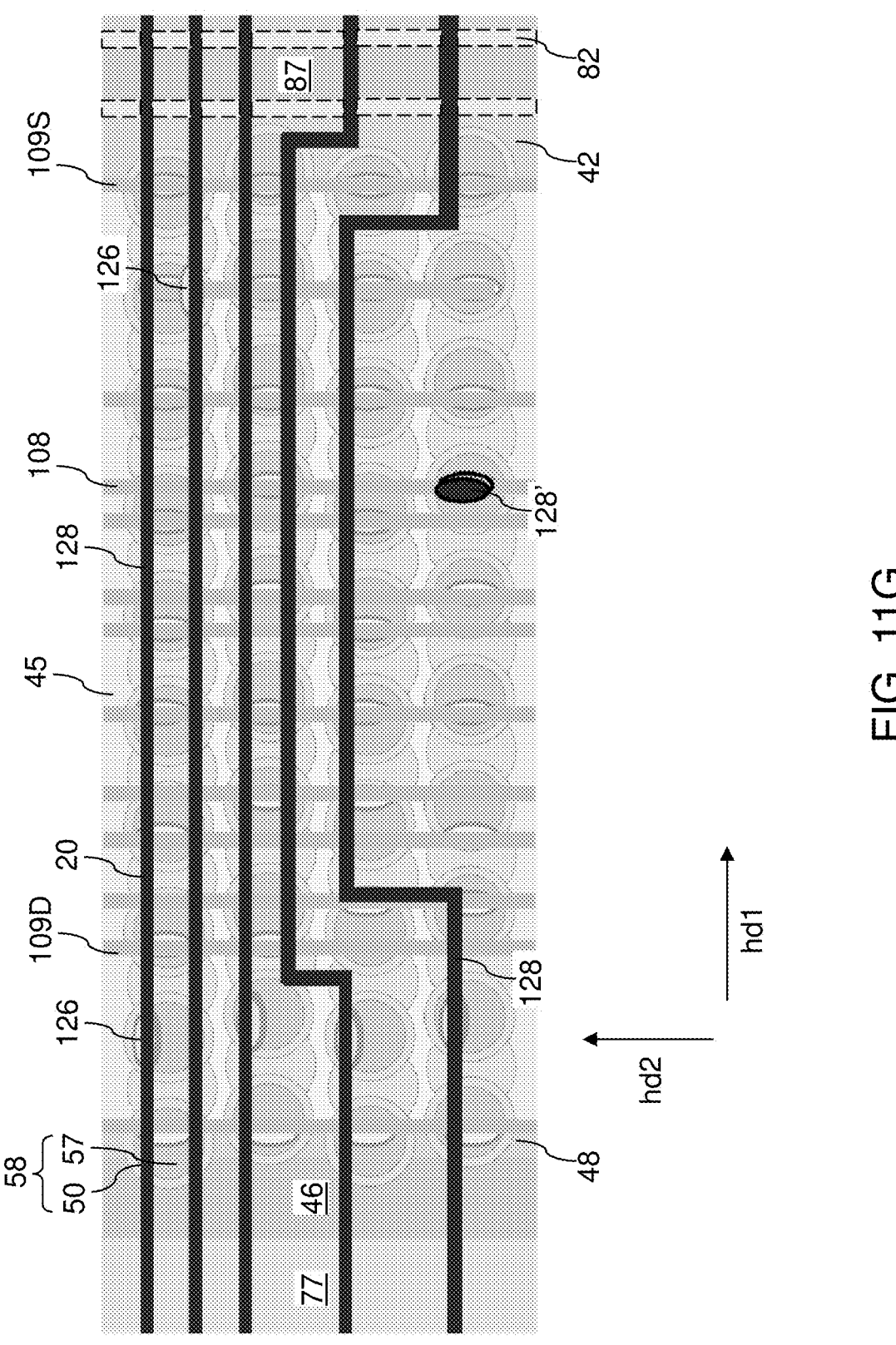

Connection via structures 126 can be formed on top of the word-line metal lines 108, the source-select metal lines 109S, the drain-select metal lines 109D, and the connection metal pads 108', as shown in FIG. 11F. Second-line-level metal lines 128 and second-line-level metal pads 128' can be formed on the connection via structures 126, as shown in FIG. 11G.

Figures 12A, 12B:
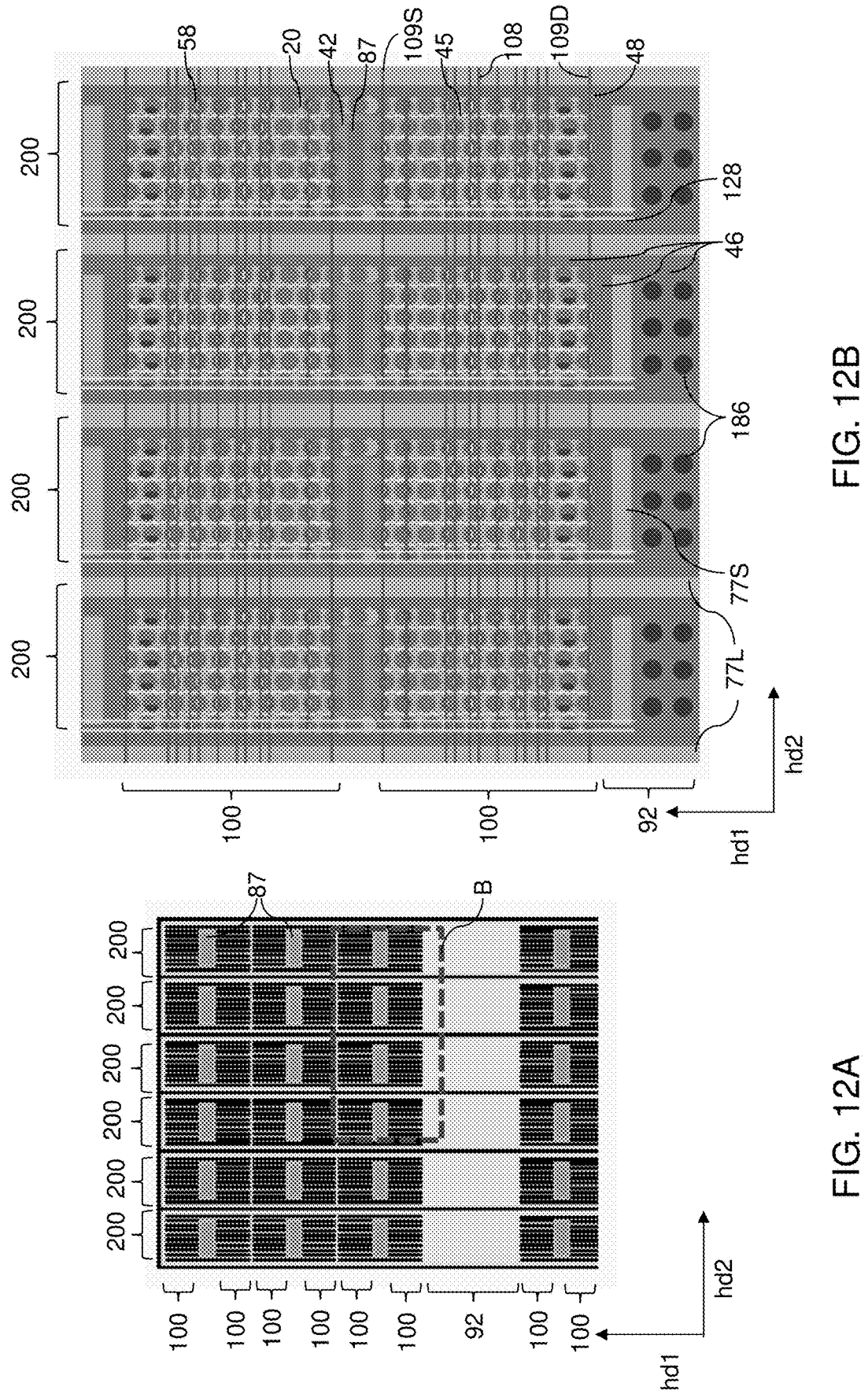
FIG. 12A is a schematic top view of a portion of a memory plane according to an embodiment of the present disclosure.
FIG. 12B is a magnified view of region B of FIG. 12A.

FIG. 12A is a schematic top view of a portion of a memory plane according to an embodiment of the present disclosure. FIG. 12B is a magnified view of region B of FIG. 12A. As shown in FIGS. 12A and 12B, the memory fingers 200 extend along the first horizontal direction and include plural memory blocks 100 and at least one staircase region 92. The combination of the drain region 48 and the shorter portion 77S of the trench fill structure 77 and the combination of the electrically conductive core 87 and the source region 42 separate the horizontal semiconductor channel strips 45 along the first horizontal direction hd1. Thus, each of the horizontal semiconductor channel strips 45 does not extend past the end of each memory block 100. A common electrically conductive core (e.g., source line portion) 87 and a common source region 42 surrounding the common electrically conductive core 87 may be shared between two adjacent memory blocks 100 in each memory finger 200. A single staircase region 92 may be used to provide the layer contact via structures 186 for the electrically conductive layers (e.g., bit lines) 46 which extend to plural memory blocks 100 in each memory finger 200.

Figure 12C:
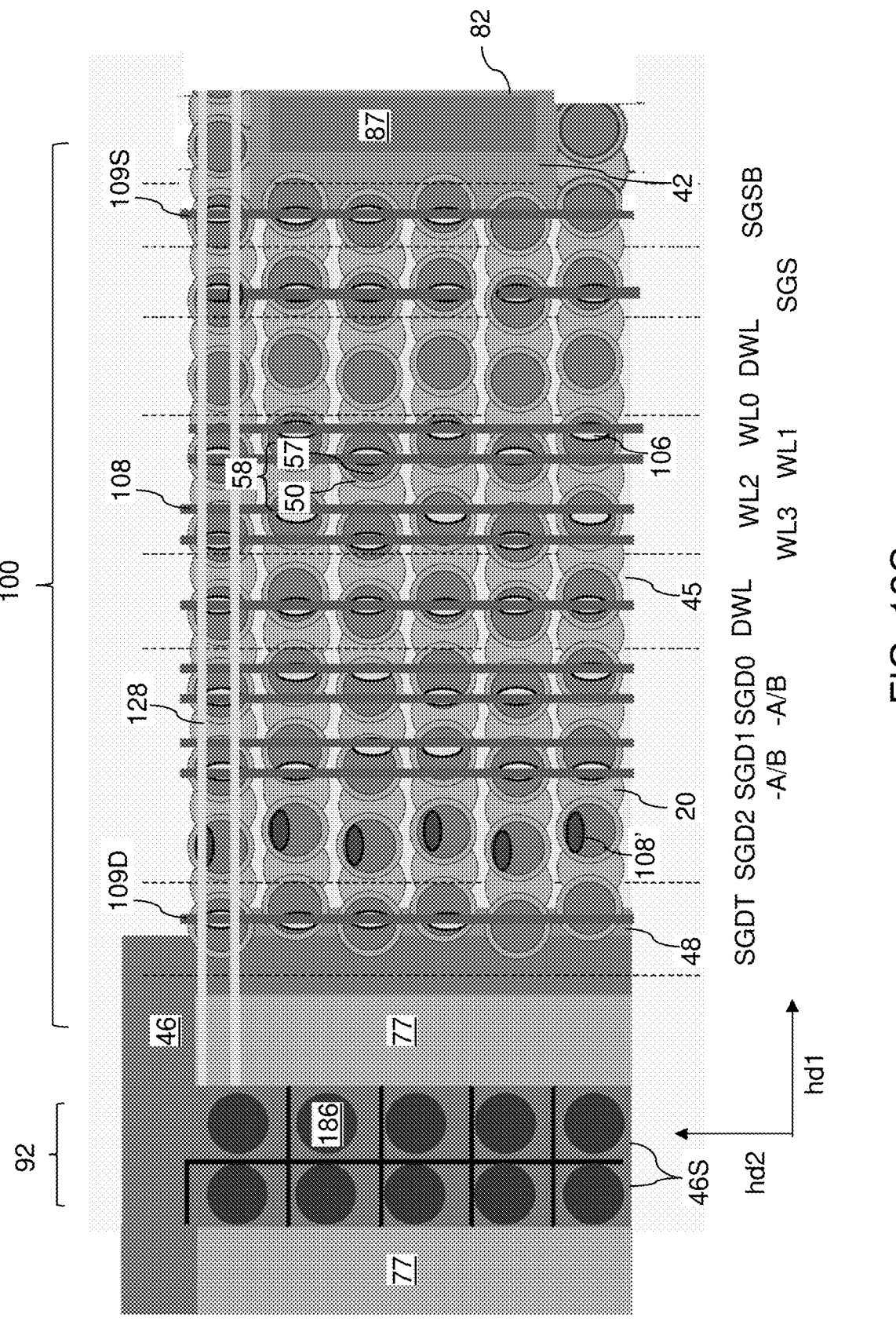
FIG. 12C is a see-through top-down view of a portion of one memory block of FIG. 12B.
Figure 12D:
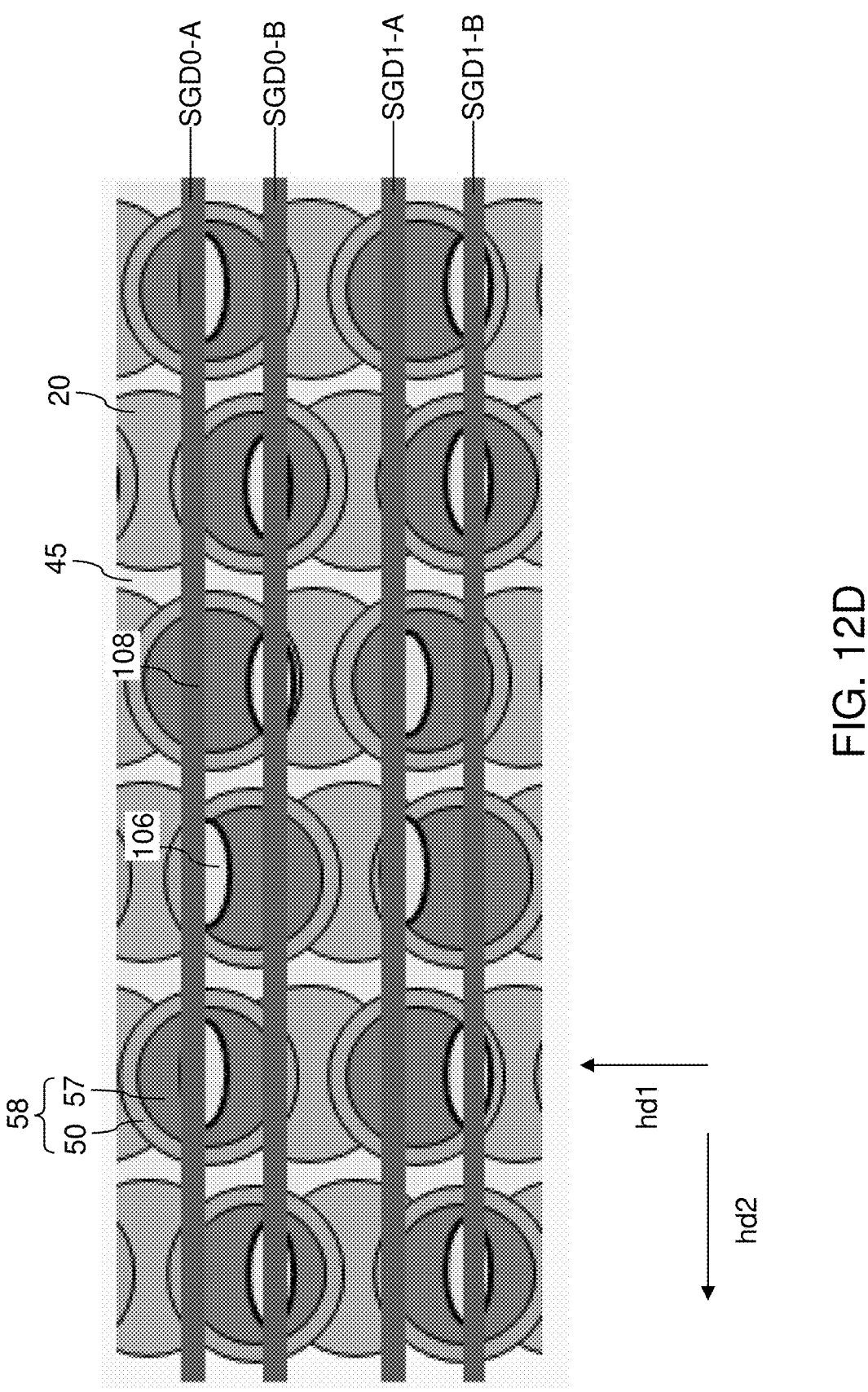
FIG. 12D is a magnified view of a region of the see-through top-down view of FIG. 12C.

Referring to FIGS. 12C and 12D, additional partial see-through views of the exemplary structure are shown, which illustrate various types of first-line-level metal lines 108 and the layer contact via structures 186. Generally, via cavities having different depths can be formed over the stepped surfaces 46S of the electrically conductive layers 46 in the staircase region 92 between neighboring pairs of the shorter portions 77S of the trench fill structures 77, and can be filled with an optional insulating spacer and a layer contact via structure 186 to provide electrical contact with a respective stepped surface 46S of one of the electrically conductive layers 46. In one embodiment, each of the electrically conductive layers 46 of the vertically-perforated composite layers (45, 42, 48, 46) does not include any opening therethrough, and is contacted by a bottom surface of a respective layer contact via structure 186.

The various metal lines at the first line level may comprise word-line metal lines 108, which may include i-th word-line metal lines WL(i–1) in which the index i runs from 1 to N, N being an integer greater than 1. In the illustrated example, N is 4. For example, a memory plane may include 100 to 10,000 memory fingers 200. Each memory finger 200 may include 100 to 500 vertically stacked electrically conductive layers (e.g., bit lines) 46. For example, a memory plane may include 500 memory fingers 200, and 200 bit lines 46 per memory finger 200. This results in 100,000 bit lines per memory plane.

The various metal lines at the first line level may further comprise source-select metal lines 109S, which may include a channel-end source-select-gate metal line SGSB and at least one additional source-select-gate metal line SGS, which may be comprise two segments in each memory block which are not electrically connected to each other. The various metal lines at the first line level may further comprise drain-select metal lines 109D, which may include a channel-end drain-select-gate metal line SGDT and a plurality of drain-select-gate metal lines (SGD0-A, SGD0-B, SGD1-A, SGD1-B. In addition, the various metal lines at the first line level may further comprise dummy-word-line metal lines DWL. The second-line-level metal lines 128 may comprise source and drain-select-gate metal lines, such as SGS and SGD2 lines.

Figure 13A:
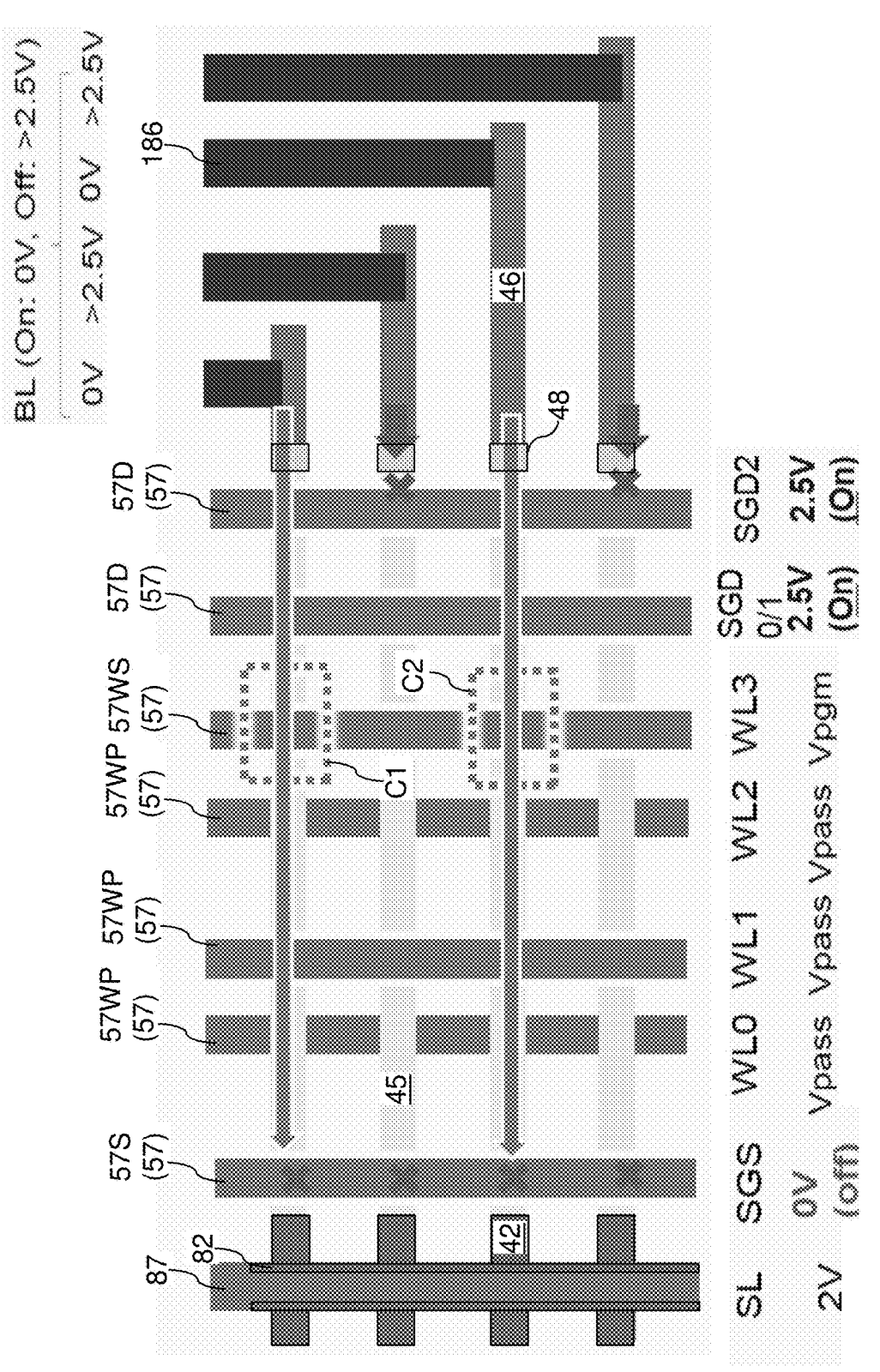

Referring to FIG. 13A, a schematic vertical cross-sectional view of the exemplary structure is illustrated during a programming step of memory cell C1 without programming memory C2 which shares the same word line as memory cell C1. The NAND strings include the horizontal semiconductor channel strips 45 that are controlled by a source-select electrodes 57S and drain-select electrodes 57D. The programming table for the structure of FIG. 13A is shown in FIG. 13B. The SGS source-select electrode 57S is turned off (e.g., by applying 0V thereto). A pass voltage for turning on a horizontal semiconductor channel strip 45 is applied to each passing word line electrode 57WP (i.e., to each unselected word line electrode), and a programming voltage is applied to the selected word line electrode 57WS. Both the selected memory cell C1 and the unselected memory cell C2 share the selected word line electrode 57WS. Therefore, the drain-select electrodes 57D (SGD0/1 and SGD2) of the NAND string containing the selected memory cell C1 are turned on (e.g., by application of a positive voltage, such as 2.5V), while the drain-select electrodes 57D (SGD0/1 and SGD2) of the NAND string containing the unselected memory cell C2 are turned off (e.g., by application of 0V thereto). The selected bit lines 46 of the levels of the selected memory cell C1 and the unselected memory cell C2 are turned on (e.g., by application of 0V), while the unselected bit lines 46 of the remaining levels are turned off (e.g., by application of a high positive voltage, e.g., greater than 2.5V applied to the drain-select-gate metal lines of electrodes 57D).

Figure 14A:
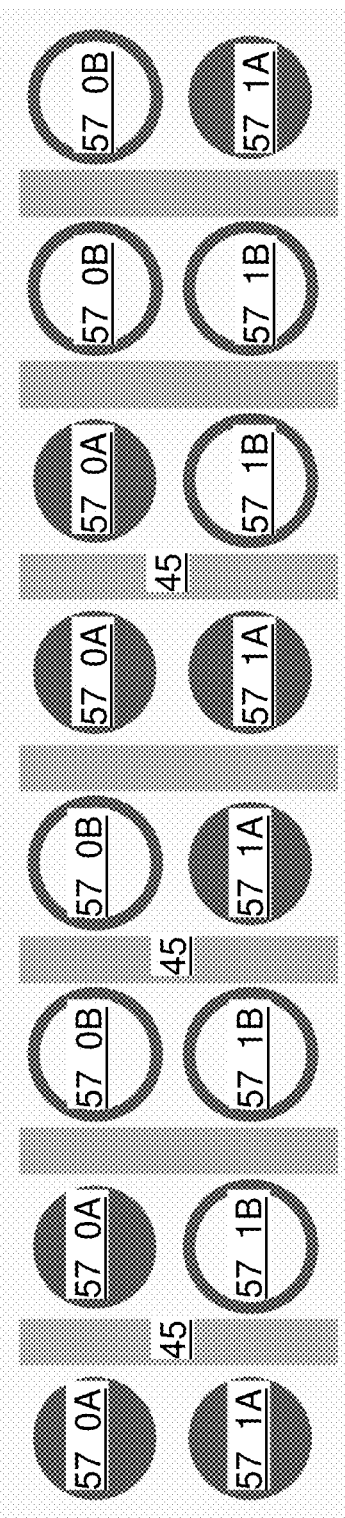
FIG. 14A is a schematic view of drain-select electrodes of FIG. 12D during the programming operation.

FIG. 14A illustrates a schematic view of the drain-select electrodes (SGD0-A, SGD0-B, SGD1-A, SGD1-B, SGD2) shown in FIG. 12D during a programming operation. Each first-row first-type electrode 57_0A can be electrically connected to a first-row first-type drain-select-gate metal line SGD0-A; each first-row second-type electrode 57_0B can be electrically connected to a first-row second-type drain-select-gate metal line SGD0-B; each second-row first-type electrode 57_1A can be electrically connected to a second-row first-type drain-select-gate metal line SGD1-A; and each second-row second-type electrode 57_1B can be electrically connected to a second-row second-type drain-select-gate metal line SGD1-B.

Figure 14B:
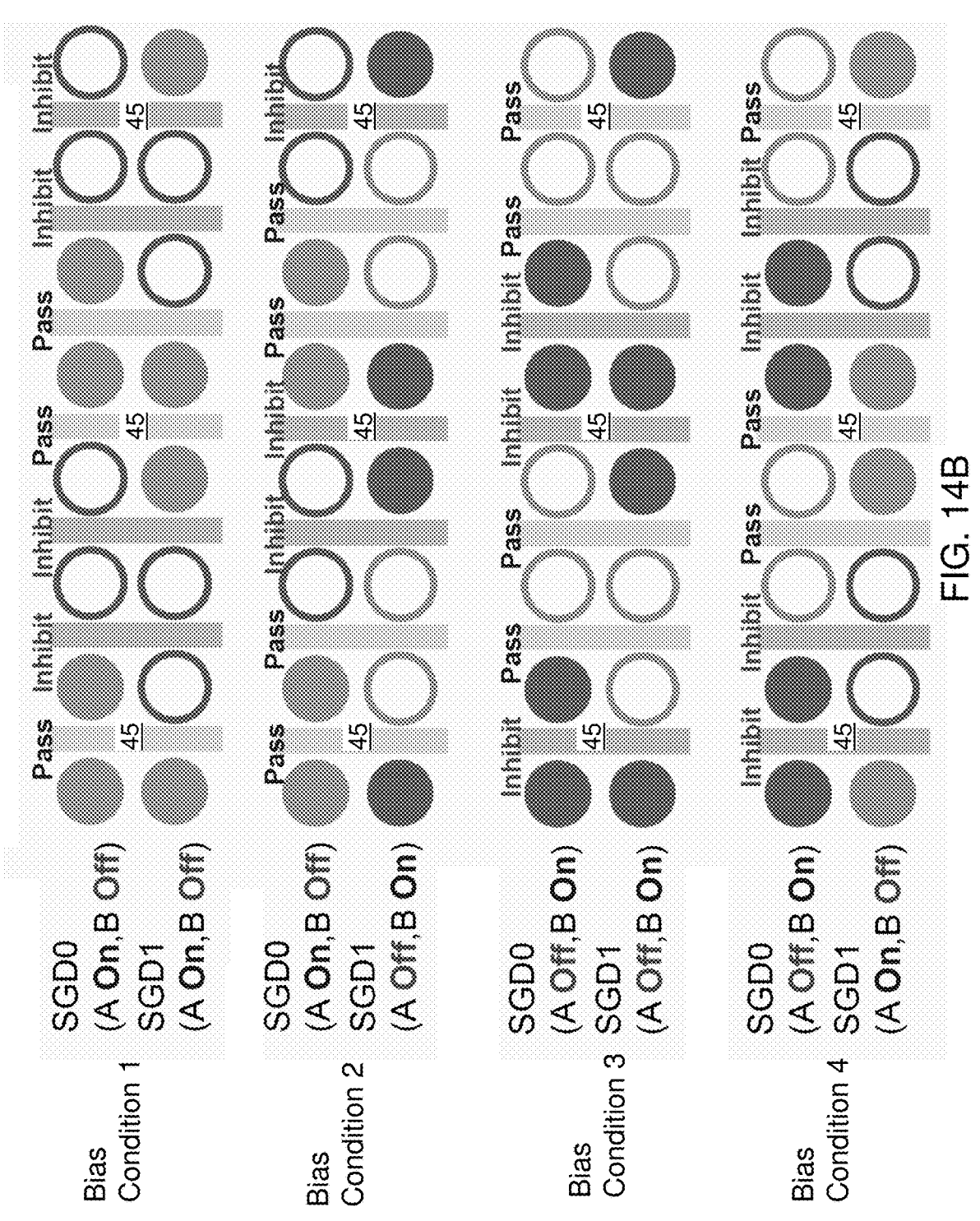
FIG. 14B illustrates an exemplary biasing scheme for programming a memory device of FIG. 14A.

Referring to FIG. 14B, various bias conditions for selectively turning on (i.e., for generating a "Pass" condition) a selected subset of the horizontal semiconductor channel strips 45 while turning off (i.e., for generating an "Inhibit" condition) an unselected subset of the horizontal semiconductor channel strips 45 are illustrated for the drain-select electrodes illustrated in FIG. 14A. In each of the four bias conditions, one of the first-row first-type drain-select-gate metal line SGD0-A electrically connected to the respective first-row first-type electrode 57_0A and the first-row second-type drain-select-gate metal line SGD0-B electrically connected to the respective first-row second-type electrode 57_0B is biased with an "on" voltage while another of the first-row first-type drain-select-gate metal line SGD0-A and the first-row second-type drain-select-gate metal line SGD0-B is biased with an "off" voltage. Furthermore, one of the second-row first-type drain-select-gate metal line SGD1-A electrically connected to the respective second-row first-type electrode 57_1A and the second-row second-type drain-select-gate metal line SGD1-B electrically connected to the respective second-row second-type electrode 57_1B is biased with an "on" voltage while another of the second-row first-type drain-select-gate metal line SGD1-A and the second-row second-type drain-select-gate metal line SGD0-B is biased with an "off" voltage.

FIG. 15A is a schematic vertical cross-sectional view of the exemplary structure shown in FIG. 13A during a reading operation of the selected memory cell C1, while FIG. 15B is a reading table for the exemplary structure of FIG. 15A.

Figure 16:
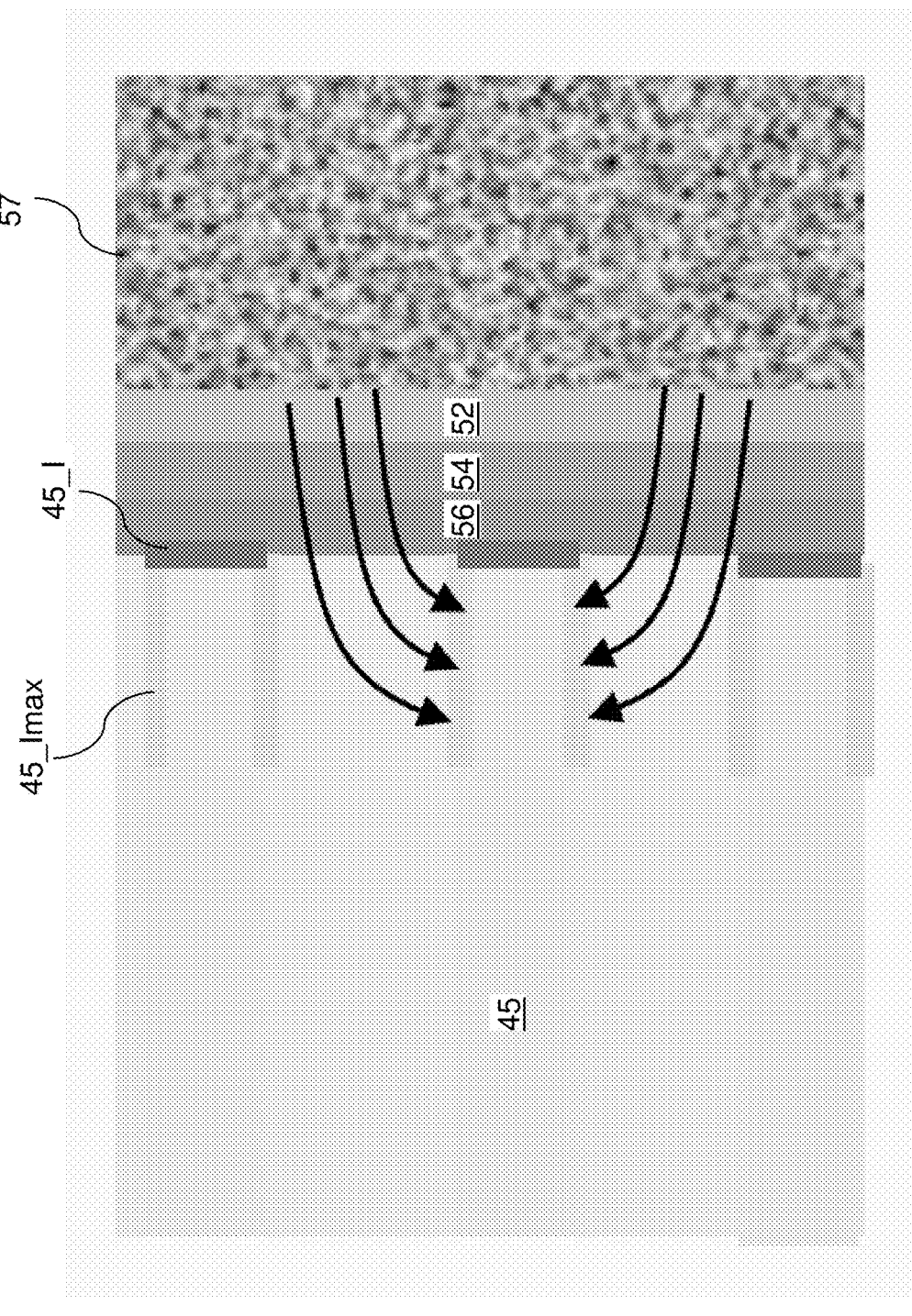
FIG. 16 is a vertical cross-sectional view illustrating formation of inversion regions in horizontal semiconductor channels according to an embodiment of the present disclosure.

Referring to FIG. 16, formation of an inversion region 45_I around an electrically biased electrode (e.g., word line) 57 is illustrated. The electric field generated by the electrode 57 forms the inversion region within a surface portion of a horizontal semiconductor channel strip 45 in proximity to an interface between the horizontal semiconductor channel strip 45 and a tunneling dielectric layer 56. Increase in the magnitude of the voltage can increase the volume of the inversion region 45_I. A maximum extent 45_Imax of the inversion region 45_I under a maximum voltage condition is also illustrated.

Referring to FIGS. 1A-16 and according to various embodiments of the present disclosure, a semiconductor device comprises: a vertically alternating sequence {32, (45, 42, 48, 46)} of vertically-perforated insulating layers 32 and vertically-perforated composite layers (45, 42, 48, 46); and laterally alternating sequences (58, 20) of laterally-insulated electrode structures 58 and dielectric isolation pillar structures 20. A plurality of elongated openings vertically extends through each of the vertically-perforated insulating layers 32 and the vertically-perforated composite layers (45, 42, 48, 46) in the vertically alternating sequence {32, (45, 42, 48, 46)}. Each of the vertically-perforated composite layers (45, 42, 48, 46) comprises a respective plurality of horizontal semiconductor channel strips 45, Each of the respective plurality of horizontal semiconductor channel strips 45 is located between each neighboring pair of the plurality of elongated openings. Each of the laterally alternating sequences (58, 20) is located within a respective elongated opening of the plurality of elongated openings. A respective subset of the laterally-insulated electrode structures 58 and a respective subset of the dielectric isolation pillar structures 20 laterally alternate along a first horizontal direction hd1 within each of the laterally alternating sequences (58, 20).

In one embodiment, each of the vertically-perforated composite layers (45, 42, 48, 46) further comprises a respective source region 42 contacting and forming a respective first p-n junction with a first end of each horizontal semiconductor channel strip 45 of the respective plurality of horizontal semiconductor channel strips 45. In one embodiment, each of the vertically-perforated composite layers (45, 42, 48, 46) further comprises a respective plurality of drain regions 48, wherein each drain region 48 within the respective plurality of drain regions 48 contacts and forms a second p-n junction with a second end of a respective one of the horizontal semiconductor channel strips 45.

In one embodiment, the respective source region 42 contacts each horizontal semiconductor channel strip 45 of the respective plurality of horizontal semiconductor channel strips 45; and the respective plurality of drain regions 48 are laterally spaced apart from each other by the laterally alternating sequences (58, 20) of laterally-insulated electrode structures 58 and dielectric isolation pillar structures 20. In one embodiment, each of the vertically-perforated composite layers (45, 42, 48, 46) further comprises a respective electrically conductive layer (e.g., horizontal bit line) 46 located between a vertically separated pair of the vertically-perforated insulating layers 32 and in contact with sidewalls of the respective plurality of drain regions 48. In one embodiment, each of the electrically conductive layers 46 of the vertically-perforated composite layers (45, 42, 48, 46) forms a staircase region 92 and does not include any opening therethrough, and is contacted by a bottom surface of a respective layer contact via structure 186 in the staircase region 92.

In one embodiment, the three-dimensional memory device comprises source line 88 vertically extending through each layer within the vertically alternating sequence {32, (45, 42, 48, 46)} and comprising: a doped semiconductor spacer 82 comprising vertically-extending wall portions and contacting each of the source regions 42 of the vertically-perforated composite layers (45, 42, 48, 46); and the electrically conductive core 87 contacting inner sidewalls of the doped semiconductor spacer.

In one embodiment, a first subset of the laterally-insulated electrode structures 58 comprises memory pillar structures each including a memory film 50 and a word line electrode 57. In one embodiment, the memory film 50 comprises, from outside to inside, a tunneling dielectric layer 56, a memory material layer 54, and a blocking dielectric layer 52. In one embodiment, a second subset of the laterally-insulated electrode structures 58 comprises insulated drain-select pillar structures including a layer stack 50' having a same composition as the memory film 50 and further including a drain-select electrode.

In one embodiment, each of the laterally-insulated electrode structures 58 vertically extends through each of the vertically-perforated insulating layers 32 and each of the vertically-perforated composite layers (45, 42, 48, 46) in the vertically alternating sequence {32, (45, 42, 48, 46)}. In one embodiment, each of the vertically-perforated insulating layers 32 contacts each of the laterally-insulated electrode structures 58 and each of the dielectric isolation pillar structures 20.

In one embodiment, each of the laterally-insulated electrode structures 58 comprises two vertical stacks of outer surface segments contacting surface segments of two vertical stacks of horizontal semiconductor channel strips 45. In one embodiment, each outer surface segment within the two vertical stacks of outer surface segments comprises a vertically-straight and laterally convex-surface segment; and each surface segment of the two vertical stacks of horizontal semiconductor channel strips 45 that contacts a respective laterally-insulated electrode structure 58 comprises a vertically-straight and laterally-concave surface segment.

In one embodiment, one, a plurality, and/or each, of the dielectric isolation pillar structures 20 comprises: a pair of vertically-straight and laterally-convex surface segments contacting two vertical stacks of horizontal semiconductor channel strips 45; and a pair of vertically-straight and laterally-concave surface segments contacting a neighboring pair of the laterally-insulated electrode structures 58.

The various embodiments of the present disclosure can be employed to provide a three-dimensional memory device including horizontal semiconductor channel strips 45 laterally extending between neighboring pairs of laterally alternating sequences (58, 20) of laterally-insulated electrode structures 58 and dielectric isolation pillar structures 20. A high-density NAND memory device may be provided. Furthermore, if the number of vertical device levels is increased, the channel length is not changed.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Whenever two or more elements are listed as alternatives in a same paragraph of in different paragraphs, a Markush group including a listing of the two or more elements is also impliedly disclosed. Whenever the auxiliary verb "can" is employed in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. If publications, patent applications, and/or patents are cited herein, each of such documents is incorporated herein by reference in their entirety.

What is claimed is:

1. A semiconductor device, comprising:
a vertically alternating sequence of vertically-perforated insulating layers and vertically-perforated composite layers, wherein a plurality of elongated openings vertically extends through each of the vertically-perforated insulating layers and the vertically-perforated composite layers in the vertically alternating sequence; each of the vertically-perforated composite layers comprises a respective plurality of horizontal semiconductor channel strips; and each of the respective plurality of horizontal semiconductor channel strips is located between each neighboring pair of the plurality of elongated openings; and
laterally alternating sequences of laterally-insulated electrode structures and dielectric isolation pillar structures, wherein each of the laterally alternating sequences is located within a respective elongated opening of the plurality of elongated openings; and a respective subset of the laterally-insulated electrode structures and a respective subset of the dielectric isolation pillar structures laterally alternate along a first horizontal direction within each of the laterally alternating sequences;
wherein each of the vertically-perforated composite layers further comprises:
a respective source region contacting a first end of each horizontal semiconductor channel strip of the respective plurality of horizontal semiconductor channel strips; and
a respective plurality of drain regions contacting a second end of a respective one of the respective plurality of the horizontal semiconductor channel strips;
wherein:
the respective source region forms a first p-n junction with the first end of each horizontal semiconductor channel strip of the respective plurality of horizontal semiconductor channel strips;
the respective plurality of drain regions form second p-n junctions with the second ends of the respective one of the respective plurality of the horizontal semiconductor channel strips;
the respective source region contacts each horizontal semiconductor channel strip of the respective plurality of horizontal semiconductor channel strips; and
the respective plurality of drain regions are laterally spaced apart from each other by the laterally alternating sequences of laterally-insulated electrode structures and dielectric isolation pillar structures.

2. A semiconductor device, comprising:
a vertically alternating sequence of vertically-perforated insulating layers and vertically-perforated composite layers, wherein a plurality of elongated openings vertically extends through each of the vertically-perforated insulating layers and the vertically-perforated composite layers in the vertically alternating sequence; each of the vertically-perforated composite layers comprises a respective plurality of horizontal semiconductor channel strips; and each of the respective plurality of horizontal semiconductor channel strips is located between each neighboring pair of the plurality of elongated openings; and
laterally alternating sequences of laterally-insulated electrode structures and dielectric isolation pillar structures, wherein each of the laterally alternating sequences is located within a respective elongated opening of the plurality of elongated openings; and a respective subset of the laterally-insulated electrode structures and a respective subset of the dielectric isolation pillar structures laterally alternate along a first horizontal direction within each of the laterally alternating sequences;
wherein each of the vertically-perforated composite layers further comprises:
a respective source region contacting a first end of each horizontal semiconductor channel strip of the respective plurality of horizontal semiconductor channel strips; and a respective plurality of drain regions contacting a second end of a respective one of the respective plurality of the horizontal semiconductor channel strips;

further comprising a source line extending through each layer within the vertically alternating sequence and comprising:

a doped semiconductor spacer comprising vertically-extending wall portions and contacting each of the source regions of the vertically-perforated composite layers; and an electrically conductive core contacting inner sidewalls of the doped semiconductor spacer.

3. A semiconductor device, comprising:

a vertically alternating sequence of vertically-perforated insulating layers and vertically-perforated composite layers, wherein a plurality of elongated openings vertically extends through each of the vertically-perforated insulating layers and the vertically-perforated composite layers in the vertically alternating sequence; each of the vertically-perforated composite layers comprises a respective plurality of horizontal semiconductor channel strips; and each of the respective plurality of horizontal semiconductor channel strips is located between each neighboring pair of the plurality of elongated openings; and laterally alternating sequences of laterally-insulated electrode structures and dielectric isolation pillar structures, wherein each of the laterally alternating sequences is located within a respective elongated opening of the plurality of elongated openings; and a respective subset of the laterally-insulated electrode structures and a respective subset of the dielectric isolation pillar structures laterally alternate along a first horizontal direction within each of the laterally alternating sequences;

wherein a first subset of the laterally-insulated electrode structures comprises memory pillar structures each including a memory film and a word line electrode.

4. The semiconductor device of claim 3, wherein the memory film comprises, from outside to inside, a tunneling dielectric layer, a memory material layer, and a blocking dielectric layer.

5. The semiconductor device of claim 3, wherein a second subset of the laterally-insulated electrode structures comprises insulated drain-select pillar structures including a layer stack having a same composition as the memory film and further including a drain-select electrode.

6. A semiconductor device, comprising:

a vertically alternating sequence of vertically-perforated insulating layers and vertically-perforated composite layers, wherein a plurality of elongated openings vertically extends through each of the vertically-perforated insulating layers and the vertically-perforated composite layers in the vertically alternating sequence; each of the vertically-perforated composite layers comprises a respective plurality of horizontal semiconductor channel strips; and each of the respective plurality of horizontal semiconductor channel strips is located between each neighboring pair of the plurality of elongated openings; and laterally alternating sequences of laterally-insulated electrode structures and dielectric isolation pillar structures, wherein each of the laterally alternating sequences is located within a respective elongated opening of the plurality of elongated openings; and a respective subset of the laterally-insulated electrode structures and a respective subset of the dielectric isolation pillar structures laterally alternate along a first horizontal direction within each of the laterally alternating sequences;

wherein each of the laterally-insulated electrode structures comprises two vertical stacks of outer surface segments contacting surface segments of two vertical stacks of horizontal semiconductor channel strips.

7. The semiconductor device of claim 6, wherein:

each outer surface segment within the two vertical stacks of outer surface segments comprises a vertically-straight and laterally convex-surface segment; and each surface segment of the two vertical stacks of horizontal semiconductor channel strips that contacts a respective laterally-insulated electrode structure comprises a vertically-straight and laterally-concave surface segment.

8. A semiconductor device, comprising:

a vertically alternating sequence of vertically-perforated insulating layers and vertically-perforated composite layers, wherein a plurality of elongated openings vertically extends through each of the vertically-perforated insulating layers and the vertically-perforated composite layers in the vertically alternating sequence; each of the vertically-perforated composite layers comprises a respective plurality of horizontal semiconductor channel strips; and each of the respective plurality of horizontal semiconductor channel strips is located between each neighboring pair of the plurality of elongated openings; and laterally alternating sequences of laterally-insulated electrode structures and dielectric isolation pillar structures, wherein each of the laterally alternating sequences is located within a respective elongated opening of the plurality of elongated openings; and a respective subset of the laterally-insulated electrode structures and a respective subset of the dielectric isolation pillar structures laterally alternate along a first horizontal direction within each of the laterally alternating sequences;

wherein one of the dielectric isolation pillar structures comprises:

a pair of vertically-straight and laterally-convex surface segments contacting two vertical stacks of horizontal semiconductor channel strips; and a pair of vertically-straight and laterally-concave surface segments contacting a neighboring pair of the laterally-insulated electrode structures.

9. A method of forming three-dimensional memory device, comprising:

forming an alternating stack of insulating layers and semiconductor material layers over a substrate; and forming laterally alternating sequences of laterally-insulated electrode structures and dielectric isolation pillar structures through the alternating stack, wherein at least a portion of the laterally-insulated electrode structures each comprise a memory film and a word line electrode.

10. The method of claim 9, wherein remaining portions of the semiconductor material layers comprise horizontal semiconductor channel strips after the step of forming laterally alternating sequences of laterally-insulated electrode structures and dielectric isolation pillar structures through the alternating stack.

11. The method of claim 10, further comprising:

doping first ends of the horizontal semiconductor channel strips to form a common source layer contacting the horizontal semiconductor channel strips; and doping a second ends of the horizontal semiconductor channel strips to form a plurality of laterally spaced apart drain regions.

12. The method of claim 11, further comprising:

forming horizontal bit lines in contact with the plurality of laterally spaced apart drain regions; and forming layer contact via structures contacting a top surface of a respective one of the bit lines.

13. The method of claim 9, further comprising:

forming isolation openings through the alternating stack;

forming the dielectric isolation pillar structures in the isolation openings;

forming electrode openings through the alternating stack such that electrode openings cut through peripheral portions of the dielectric isolation pillar structures; and forming the laterally-insulated electrode structures in the electrode openings.

\* \* \* \* \*